(12) United States Patent
Park et al.

(10) Patent No.: US 10,410,686 B2
(45) Date of Patent: Sep. 10, 2019

(54) MEMORY MODULES STORING A TRIMMING CONTROL CODE ASSOCIATED WITH A MINIMUM LEVEL OF A POWER SUPPLY VOLTAGE, METHODS OF OPERATING THE MEMORY MODULES, AND TEST SYSTEMS OF THE MEMORY MODULES

(71) Applicant: SAMSUNG ELECTRONICS CO., LTD., Suwon-si, Gyeonggi-Do (KR)

(72) Inventors: Hwan-Wook Park, Seoul (KR); Yong-Jin Kim, Incheon (KR); Jin-Seong Yun, Suwon-si (KR); Kyu-Dong Lee, Seoul (KR)

(73) Assignee: SAMSUNG ELECTRONICS CO., LTD., Suwon-si, Gyeonggi-Do (KR)

( * ) Notice: Subject to any disclaimer, the term of this patent is extended or adjusted under 35 U.S.C. 154(b) by 0 days.

(21) Appl. No.: 15/956,267

(22) Filed: Apr. 18, 2018

(65) Prior Publication Data
US 2019/0115053 A1 Apr. 18, 2019

(30) Foreign Application Priority Data
Oct. 13, 2017 (KR) .......................... 10-2017-0133117

(51) Int. Cl.
*G11C 16/06* (2006.01)
*G11C 5/04* (2006.01)
(Continued)

(52) U.S. Cl.
CPC .............. *G11C 5/04* (2013.01); *G06F 1/3203* (2013.01); *G11C 5/147* (2013.01);
(Continued)

(58) Field of Classification Search
CPC ..... G11C 5/04; G11C 11/4074; G11C 11/413; G11C 29/44; G11C 5/147; G11C 16/30; G11C 16/08; G06F 1/3203
(Continued)

(56) References Cited

U.S. PATENT DOCUMENTS 5,563,838 A * 10/1996 Mart ...................... G11C 5/063
365/226
7,360,104 B2 * 4/2008 Harris ...................... G11C 5/04
365/226
(Continued)

FOREIGN PATENT DOCUMENTS

KR 1019990010766 2/1999

*Primary Examiner* — Tha-O H Bui
(74) *Attorney, Agent, or Firm* — F. Chau & Associates, LLC

(57) ABSTRACT

A memory module includes semiconductor memory devices, a power management integrated circuit (PMIC), and a control device. The semiconductor memory devices, mounted on a circuit board, operate based on a power supply voltage. The PMIC, mounted on the circuit board, generates the power supply voltage, provides the power supply voltage to the semiconductor memory devices, and stores a trimming control code associated with a minimum level of the power supply voltage when the semiconductor memory devices operate normally in a test mode. During the test mode, the PMIC adjusts a level of the power supply voltage, tests the semiconductor memory devices using the adjusted power supply voltage, and stores the trimming control code based on a result of the test. The control device controls the PMIC based on a first control signal received from an external device.

20 Claims, 18 Drawing Sheets

(51) Int. Cl.
    *G11C 16/30*    (2006.01)
    *G11C 5/14*    (2006.01)
    *G06F 1/3203*    (2019.01)
    *G11C 16/08*    (2006.01)
    *G11C 29/44*    (2006.01)
    *G11C 11/413*    (2006.01)
    *G11C 11/4074*    (2006.01)

(52) U.S. Cl.
    CPC ........ *G11C 11/4074* (2013.01); *G11C 11/413* (2013.01); *G11C 16/08* (2013.01); *G11C 16/30* (2013.01); *G11C 29/44* (2013.01)

(58) Field of Classification Search
    USPC .................................................. 365/185.14
    See application file for complete search history.

(56) References Cited

U.S. PATENT DOCUMENTS

| | | | |
|---|---|---|---|
| 8,018,753 B2 * | 9/2011 | Carr .................. | G11C 5/04 |
| | | | 365/226 |
| 8,582,388 B1 | 11/2013 | Hu et al. | |
| 8,861,277 B1 | 10/2014 | Rategh et al. | |
| 9,229,747 B2 * | 1/2016 | Berke ................ | G11C 5/14 |
| 9,240,248 B2 | 1/2016 | Rategh et al. | |
| 9,576,615 B1 | 2/2017 | Mahran et al. | |
| 9,606,598 B2 | 3/2017 | Luo et al. | |
| 9,627,028 B2 * | 4/2017 | Mera ................. | G11C 11/4074 |

\* cited by examiner

MEMORY MODULES STORING A TRIMMING CONTROL CODE ASSOCIATED WITH A MINIMUM LEVEL OF A POWER SUPPLY VOLTAGE, METHODS OF OPERATING THE MEMORY MODULES, AND TEST SYSTEMS OF THE MEMORY MODULES

CROSS-REFERENCE TO RELATED APPLICATION

This application claims priority under 35 U.S.C. § 119 to Korean Patent Application No. 10-2017-0133117, filed on Oct. 13, 2017 in the Korean Intellectual Property Office (KIPO), the disclosure of which is incorporated by reference herein in its entirety.

TECHNICAL FIELD

Exemplary embodiments of the inventive concept relate to a memory device, and more particularly, to memory modules, methods of operating the memory modules, and test systems of the memory modules.

DISCUSSION OF RELATED ART

A semiconductor memory may be a memory device that is implemented using a semiconductor such as silicon (Si), germanium (Ge), gallium arsenide (GaAs), indium phospide (InP), or the like. Semiconductor memory devices are typically divided into volatile memory devices and nonvolatile memory devices.

A volatile memory device refers to a memory device in which stored data is lost when a power supply is shut down. On the other hand, a nonvolatile memory device refers to a memory device that retains stored data when a power supply is shut down. Because a dynamic random access memory (DRAM), which is a kind of volatile memory device, has a high access speed, the DRAM is widely used as a working memory, a buffer memory, a main memory, or the like of a computing system. Because a DRAM memory cell generally includes a capacitor and a transistor, it is difficult to reduce a cell size thereof. Thus, it may be difficult to implement a high-capacity DRAM within a limited area. For high-capacity, a plurality of DRAMs may be provided in the form of a memory module.

SUMMARY

According to an exemplary embodiment of the inventive concept, a memory module includes a plurality of semiconductor memory devices, a power management integrated circuit (PMIC), and a control device. The plurality of semiconductor memory devices are mounted on a circuit board, and operate based on a power supply voltage. The PMIC, mounted on the circuit board, generates the power supply voltage using an input voltage, provides the power supply voltage to the plurality of semiconductor memory devices, and stores a trimming control code associated with a first target level corresponding to a minimum level of the power supply voltage when the plurality of semiconductor memory devices operate normally in a test mode. During the test mode, the PMIC adjusts a level of the power supply voltage, tests the semiconductor memory devices using the adjusted power supply voltage, and stores the trimming control code based on a result of the test. The control device controls the PMIC in response to a first control signal received from an external device.

According to an exemplary embodiment of the inventive concept, in a method of operating a memory module, which includes a plurality of semiconductor memory devices mounted on a circuit board and a power management integrated circuit (PMIC) mounted on the circuit board to provide a power supply voltage to the plurality of semiconductor memory devices, the memory module is instructed to enter into a test mode, a trimming control code associated with a level of the power supply voltage is reset, the plurality of semiconductor memory devices are tested at a first level of the power supply voltage, and the level of the power supply voltage is adjusted based on a result of the testing the plurality of semiconductor memory devices with the adjusted power supply voltage.

According to an exemplary embodiment of the inventive concept, a test system of a memory module includes a memory module and an automated test equipment (ATE). The memory module includes a plurality of semiconductor memory devices mounted on a circuit board and a power management integrated circuit (PMIC) mounted on the circuit board and configured to provide a power supply voltage to the plurality of semiconductor memory devices. The ATE tests the plurality of semiconductor memory devices. The memory module further includes a control device to control the PMIC in response to a control signal received from the ATE. The PMIC generates the power supply voltage using an input voltage, provides the power supply voltage to the plurality of semiconductor memory devices, tests the plurality of semiconductor memory devices by adjusting a level of the power supply voltage in a test mode, and stores a trimming control code associated with a minimum level of the power supply voltage when the plurality of semiconductor memory devices operate normally.

BRIEF DESCRIPTION OF THE DRAWINGS

The above and other features of the inventive concept will be more clearly understood by describing in detail exemplary embodiments thereof with reference to the accompanying drawings.

DETAILED DESCRIPTION OF THE EMBODIMENTS

Figure 1:
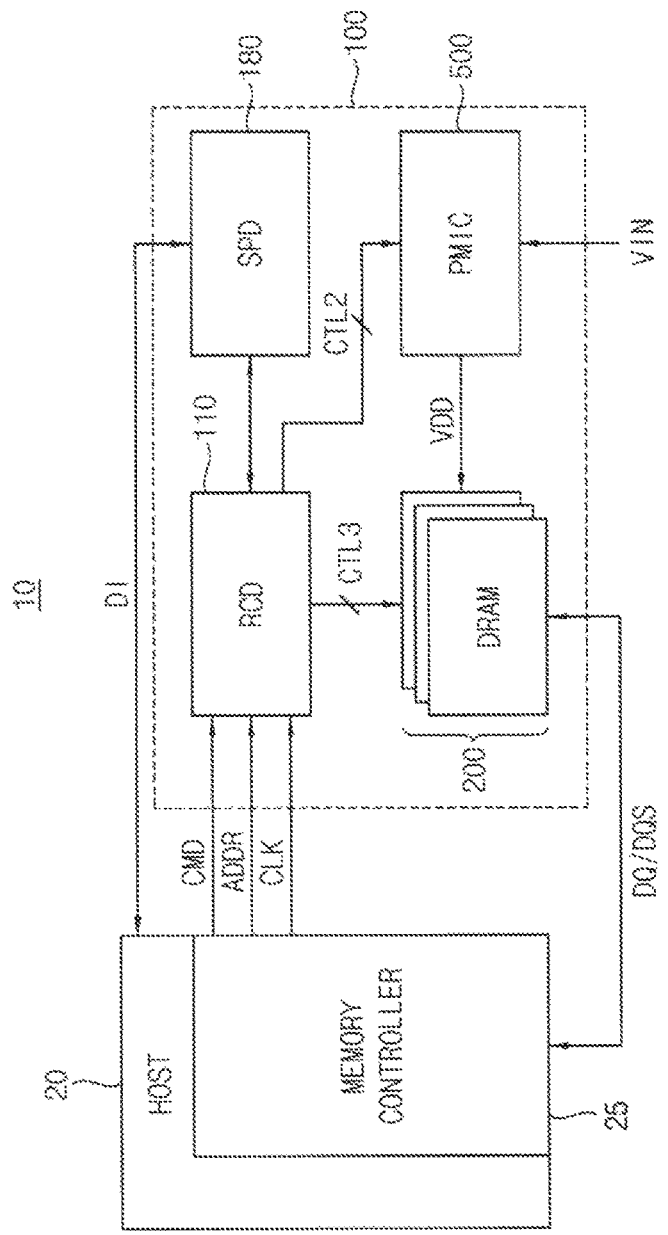
FIG. 1 is a block diagram illustrating a memory system according to exemplary embodiments of the inventive concept.

Exemplary embodiments of the inventive concept provide a memory module capable of enhancing performance and increasing yield.

Exemplary embodiments of the inventive concept provide a method of operating the memory module capable of enhancing performance and increasing yield.

Exemplary embodiments of the inventive concept provide a test system of the memory module capable of enhancing performance and increasing yield.

Exemplary embodiments of the inventive concept will be described more fully hereinafter with reference to the accompanying drawings. Like reference numerals may refer to like elements throughout this application.

FIG. 1 is a block diagram illustrating a memory system according to exemplary embodiments of the inventive concept.

Referring to FIG. 1, a memory system 10 includes a host 20 and a memory module 100. The host 20 may include a memory controller 25.

The memory module 100 may include a control device 110 (e.g., a registered clock driver (RCD), the RCD may hereinafter be referred to as the control device), a serial presence detect (SPD) chip 180, semiconductor memory devices 200, and a power management integrated circuit (PMIC) 500.

The control device 110, under control of the memory controller 25, may control the semiconductor memory devices 200 and the PMIC 500. For example, the control device 110 may receive an address ADDR, a command CMD, and a clock signal CLK from the memory controller 25. In response to the received signals, the control device 110 may control the semiconductor memory devices 200 such that data received through a data signal DQ and a data strobe signal DQS is written in the semiconductor memory devices 200 or data stored in the semiconductor memory devices 200 is output through the data signal DQ and the data strobe signal DQS. For example, the control device 110 may transmit the address ADDR, the command CMD, and the clock signal CLK from the memory controller 25 to the semiconductor memory devices 200.

The semiconductor memory devices 200 may write data received through the data signal DQ and the data strobe signal DQS under control of the control device 110. Alternatively, the semiconductor memory devices 200 may output the written data through the data signal DQ and the data strobe signal DQS under control of the control device 110. For example, the semiconductor memory devices 200 may include a volatile memory device such as a dynamic random-access memory (DRAM), a static random-access memory (SRAM), a synchronous dynamic random-access memory (SDRAM), etc. For example, the semiconductor memory devices 200 may include DRAM-based volatile memory devices. For example, the semiconductor memory devices 200 may include a double data rate 5 (DDR5) SDRAM.

The SPD 180 may be a programmable read only memory (e.g., electrically erasable programmable read-only memory (EEPROM)). The SPD 180 may include initial information or device information DI of the memory module 100. In exemplary embodiments of the inventive concept, the SPD 180 may include the initial information or the device information DI such as a module form, a module configuration, a storage capacity, a module type, an execution environment, or the like of the memory module 100. When the memory system 10 including the memory module 100 is booted up, the host 20 may read the device information DI from the SPD 180 and may recognize the memory module 100 based on the device information DI. The host 20 may control the memory module 100 based on the device information DI from the SPD 180. For example, the host 20 may recognize a type of the semiconductor memory devices 200 included in the memory module 100 based on the device information DI from the SPD 180.

In exemplary embodiments of the inventive concept, the SPD 180 may communicate with the host 20 through a serial bus. For example, the host 20 may exchange a signal with the SPD 180 through the serial bus. The SPD 180 may also communicate with the control device 110 through the serial bus. The serial bus may include at least one of 2-line serial buses such as an inter-integrated circuit (I2C), a system management bus (SMBus), a power management bus (PMBus), an intelligent platform management interface (IPMI), a management component transport protocol (MCTP), or the like.

The control device 110 may control the PMIC 500 through a second control signal CTL2, and may control the semiconductor memory devices 200 through a third control signal CTL3. The third control signal CTL3 may include the address ADDR, the command CMD, and the clock signal CLK. A first control signal CTL1 will be described below with reference to FIG. 9.

The PMIC 500 may receive an input voltage VIN, generate a power supply voltage VDD based on the input voltage VIN, and provide the power supply voltage VDD to the semiconductor memory devices 200. The semiconductor memory devices 200 may operate based on the power supply voltage VDD.

The PMIC 500 may store a trimming control code associated with a minimum level of the power supply voltage VDD at which the semiconductor memory devices 200 operate normally while the PMIC 500 adjusts a level of the power supply voltage VDD in a test mode. The PMIC 500, in a normal mode, generates the power supply voltage VDD having the minimum level associated with the stored trimming control code, and provides the generated power supply voltage VDD to the semiconductor memory devices 200. Since the semiconductor memory devices 200 operate based on the power supply voltage VDD having a level determined through a test, yield and performance of the memory module 100 may be enhanced.

Figure 2:
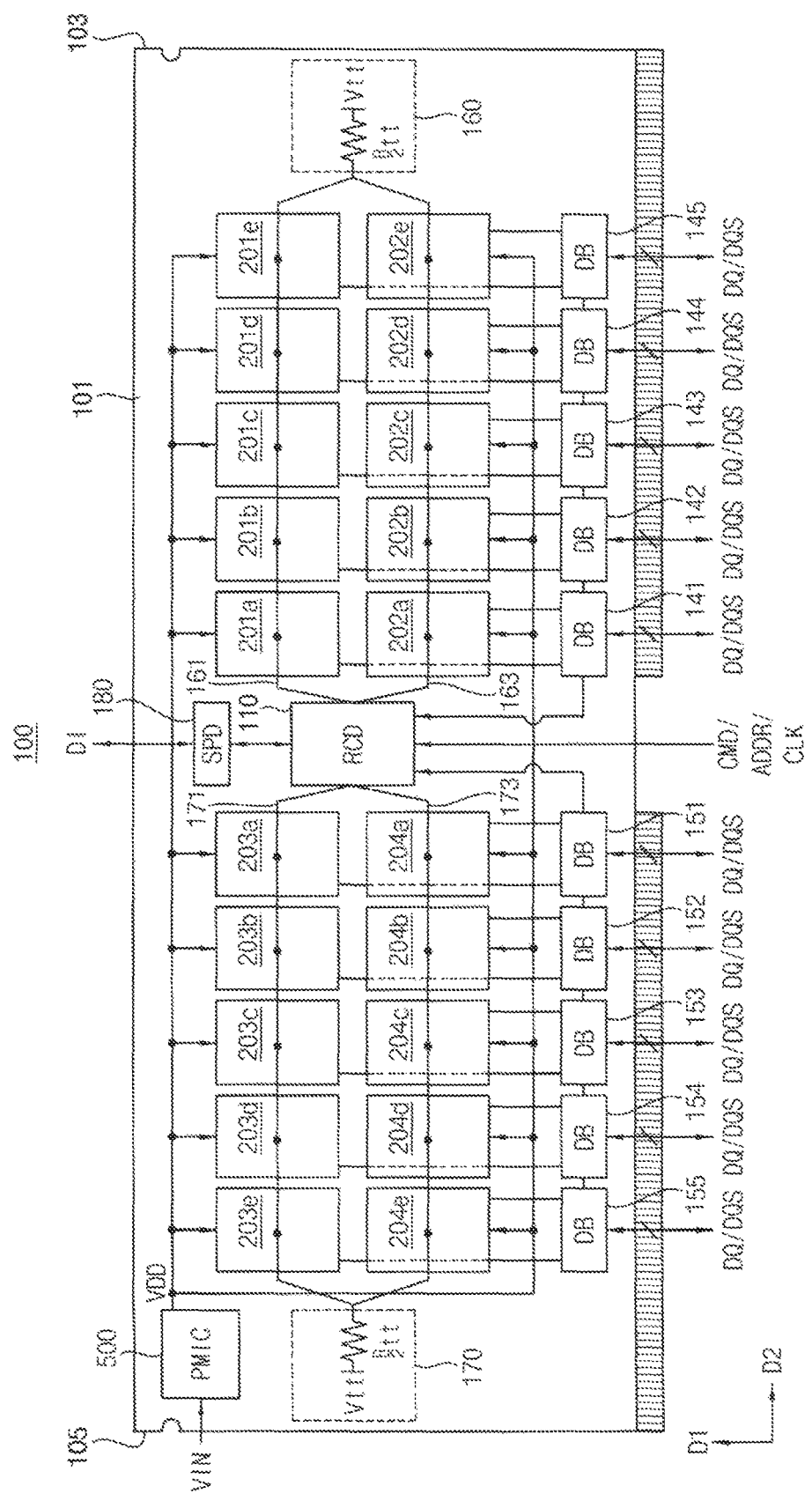
FIG. 2 is a block diagram illustrating a memory module of FIG. 1 according to exemplary embodiments of the inventive concept.

FIG. 2 is a block diagram illustrating a memory module of FIG. 1 according to exemplary embodiments of the inventive concept.

Referring to FIG. 2, the memory module 100 includes the control device 110 disposed (or mounted) in a circuit board 101, a plurality of semiconductor memory devices 201a~201e, 202a~202e, 203a~203e, and 204a~204e, a plurality of data buffers 141~145 and 151~155, module resistor units 160 and 170, and the PMIC 500.

Here, the circuit board 101 may be a printed circuit board that extends in a second direction D2, perpendicular to a first direction D1, between a first edge portion 103 and a second edge portion 105 of the first direction D1. The control device 110 may be disposed on a center of the circuit board 101. The plurality of semiconductor memory devices 201a~201e, 202a~202e, 203a~203e, and 204a~204e may be arranged in a plurality of rows between the control device 110 and the first edge portion 103 and between the control device 110 and the second edge portion 105. In this case, the semiconductor memory devices 201a~201e and 202a~202e may be arranged along a plurality of rows between the control device 110 and the first edge portion 103. The semiconductor memory devices 203a~203e and 204a~204e may be arranged along a plurality of rows between the control device 110 and the second edge portion 105.

A portion of the semiconductor memory devices 201a~201e and 202a~202e may be an error correction code (ECC) memory device. The ECC memory device may perform an ECC encoding operation to generate parity bits about data to be written at the memory cells and an ECC decoding operation to correct an error occurring in the data read from the memory cells.

Each of the plurality of semiconductor memory devices 201a~201e, 202a~202e, 203a~203e, and 204a~204e may be coupled to correspond to one of the data buffers 141~145 and 151~155 through a data transmission line for receiving/transmitting the data signal DQ and the data strobe signal DQS.

The control device 110 may provide a command/address signal to the semiconductor memory devices 201a~201e through a command/address transmission line 161 and may provide a command/address signal to the semiconductor memory devices 202a~202e through a command/address transmission line 163. In addition, the control device 110 may provide a command/address signal to the semiconductor memory devices 203a~203e through a command/address transmission line 171 and may provide a command/address signal to the semiconductor memory devices 204a~204e through a command/address transmission line 173.

The command/address transmission lines 161 and 163 may be connected in common to the module resistance unit 160 disposed to be adjacent to the first edge portion 103, and the command/address transmission lines 171 and 173 may be connected in common to the module resistance unit 170 disposed to be adjacent to the second edge portion 105.

Each of the module resistance units 160 and 170 may include a termination resistor Rtt/2 connected to a termination voltage Vtt. In this case, an arrangement of the module resistance units 160 and 170 may reduce the number of module resistance units, thus reducing an area where termination resistors are disposed.

In addition, each of the plurality of semiconductor memory devices 201a~201e, 202a~202e, 203a~203e, and 204a~204e may be a DDR5 SDRAM.

The SPD 180 may be disposed to be adjacent to the control device 110 and the PMIC 500 may be disposed between the semiconductor memory device 203e and the second edge portion 105. The PMIC 500 may generate the power supply voltage VDD based on the input voltage VIN and may provide the power supply voltage VDD to the semiconductor memory devices 201a~201e, 202a~202e, 203a~203e, and 204a~204e.

Although it is illustrated that the PMIC 500 is disposed to be adjacent to the second edge portion 105 in FIG. 2, the PMIC 500 may be disposed in a central portion of the circuit board 101 to be adjacent to the control device 110 according to exemplary embodiments of the inventive concept.

Figure 3:
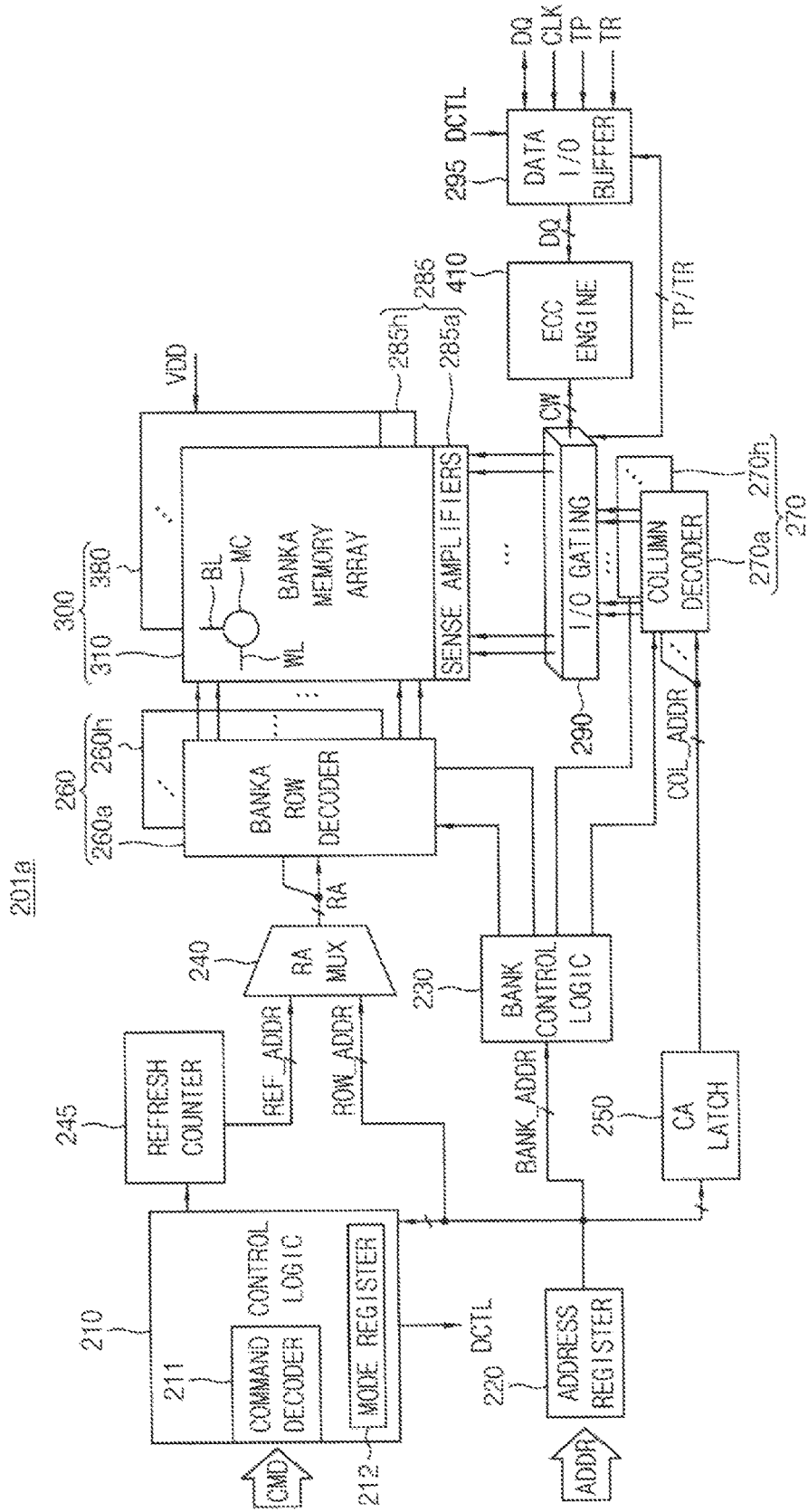
FIG. 3 is a block diagram illustrating a semiconductor memory device of FIG. 2 according to exemplary embodiments of the inventive concept.

FIG. 3 is a block diagram illustrating a semiconductor memory device of FIG. 2 according to exemplary embodiments of the inventive concept.

Referring to FIG. 3, the semiconductor memory device 201a may include a control logic circuit 210, an address register 220, a bank control logic 230, a row address multiplexer 240, a column address latch 250, a row decoder 260, a column decoder 270, a memory cell array 300, a sense amplifier unit 285, an input/output (I/O) gating circuit 290, a data input/output (I/O) buffer 295, a refresh counter 245, and an ECC engine 410.

The memory cell array 300 may include first through eighth bank arrays 310~380. The row decoder 260 may include first through eighth bank row decoders 260a~260h coupled to the first through eighth bank arrays 310~380, respectively, the column decoder 270 may include first through eighth bank column decoders 270a~270h coupled to the first through eighth bank arrays 310~380, respectively, and the sense amplifier unit 285 may include first through eighth bank sense amplifiers 285a~285h coupled to the first through eighth bank arrays 310~380, respectively. The first through eighth bank arrays 310~380, the first through eighth bank row decoders 260a~260h, the first through eighth bank column decoders 270a~270h and first through eighth bank sense amplifiers 285a~285h may form first through eighth banks. Each of the first through eighth bank arrays 310~380 may include a plurality of word-lines WL, a plurality of bit-lines BL, and a plurality of memory cells MC formed at intersections of the word-lines WL and the bit-lines BL.

Although the semiconductor memory device 201a is illustrated in FIG. 3 as including eight banks, the semiconductor memory device 201a may include any number of banks.

The address register 220 may receive the address ADDR including a bank address BANK_ADDR, a row address ROW_ADDR, and a column address COL_ADDR from the control device 110. The address register 220 may provide the received bank address BANK_ADDR to the bank control logic 230, may provide the received row address ROW_ADDR to the row address multiplexer 240, and may provide the received column address COL_ADDR to the column address latch 250.

The bank control logic 230 may generate bank control signals in response to the bank address BANK_ADDR. One of the first through eighth bank row decoders 260a~260h corresponding to the bank address BANK_ADDR may be activated in response to the bank control signals, and one of the first through eighth bank column decoders 270a~270h corresponding to the bank address BANK_ADDR may be activated in response to the bank control signals.

The row address multiplexer 240 may receive the row address ROW_ADDR from the address register 220, and may receive a refresh row address REF_ADDR from the refresh counter 245. The row address multiplexer 240 may selectively output the row address ROW_ADDR or the refresh row address REF_ADDR as a row address RA. The row address RA that is output from the row address multiplexer 240 may be applied to the first through eighth bank row decoders 260a~260h.

The activated one of the first through eighth bank row decoders 260a~260h may decode the row address RA that is output from the row address multiplexer 240, and may activate a word-line WL corresponding to the row address RA. For example, the activated bank row decoder may generate a word-line driving voltage based on the power supply voltage VDD and may apply the word-line driving voltage to one of the word-lines WL corresponding to the row address RA.

The column address latch 250 may receive the column address COL_ADDR from the address register 220, and may temporarily store the received column address COL_ADDR. In exemplary embodiments of the inventive concept, in a burst mode, the column address latch 250 may generate column addresses that increment from the received column address COL_ADDR.

The column address latch 250 may apply the temporarily stored or generated column address to the first through eighth bank column decoders 270a~270h.

The activated one of the first through eighth bank column decoders 270a~270h may decode the column address COL_ADDR that is output from the column address latch 250, and may control the I/O gating circuit 290 to output data corresponding to the column address COL_ADDR.

The I/O gating circuit 290 may include circuitry for gating input/output data. The I/O gating circuit 290 may further include read data latches for storing data that is output from the first through eighth bank arrays 310~380, and write drivers for writing data to the first through eighth bank arrays 310~380.

Data to be read from one of the first through eighth bank arrays 310~380 may be sensed by a sense amplifier coupled to the one bank array from which the data is to be read, and may be stored in the read data latches. The data stored in the read data latches may be provided to the memory controller 25 via the data I/O buffer 295 after the ECC engine 410 performs an ECC decoding on the data. Data to be written in one of the first through eighth bank arrays 310~380 may be provided to the data I/O buffer 295 from the memory controller 25. The ECC engine 410 performs an ECC encoding on the data provided to the data I/O buffer 295, and the ECC engine 410 provides the encoded data to the I/O gating circuit 290.

The data I/O buffer 295, in the test mode, receives a test pattern data TP from an external automated test equipment (ATE), provides the test pattern data TP to the I/O gating circuit 290, receives a test result data TR responding to the test pattern data TP from the memory cell array 300 via the I/O gating circuit 290, and provides the test result data TR to the ATE. The ATE compares the test pattern data TP with the test result data TR and determines whether the semiconductor memory device 201a operates normally at a given level of the power supply voltage VDD based on a result of the comparison.

The control logic circuit 210 may control operations of the semiconductor memory device 201a. For example, the control logic circuit 210 may generate control signals for the semiconductor memory device 201a to perform a write operation or a read operation. The control logic circuit 210 may include a command decoder 211 that decodes the command CMD received from the memory controller 25 through the control device 110 and a mode register 212 that sets an operation mode of the semiconductor memory device 201a.

For example, the command decoder 211 may generate the control signals corresponding to the command CMD by decoding a write enable signal, a row address strobe signal, a column address strobe signal, a chip select signal, etc. The control logic circuit 210 may generate a control signal DCTL to control an operation of the data I/O buffer 295 and may provide the control signal DCTL to the data I/O buffer 295.

Figure 4:
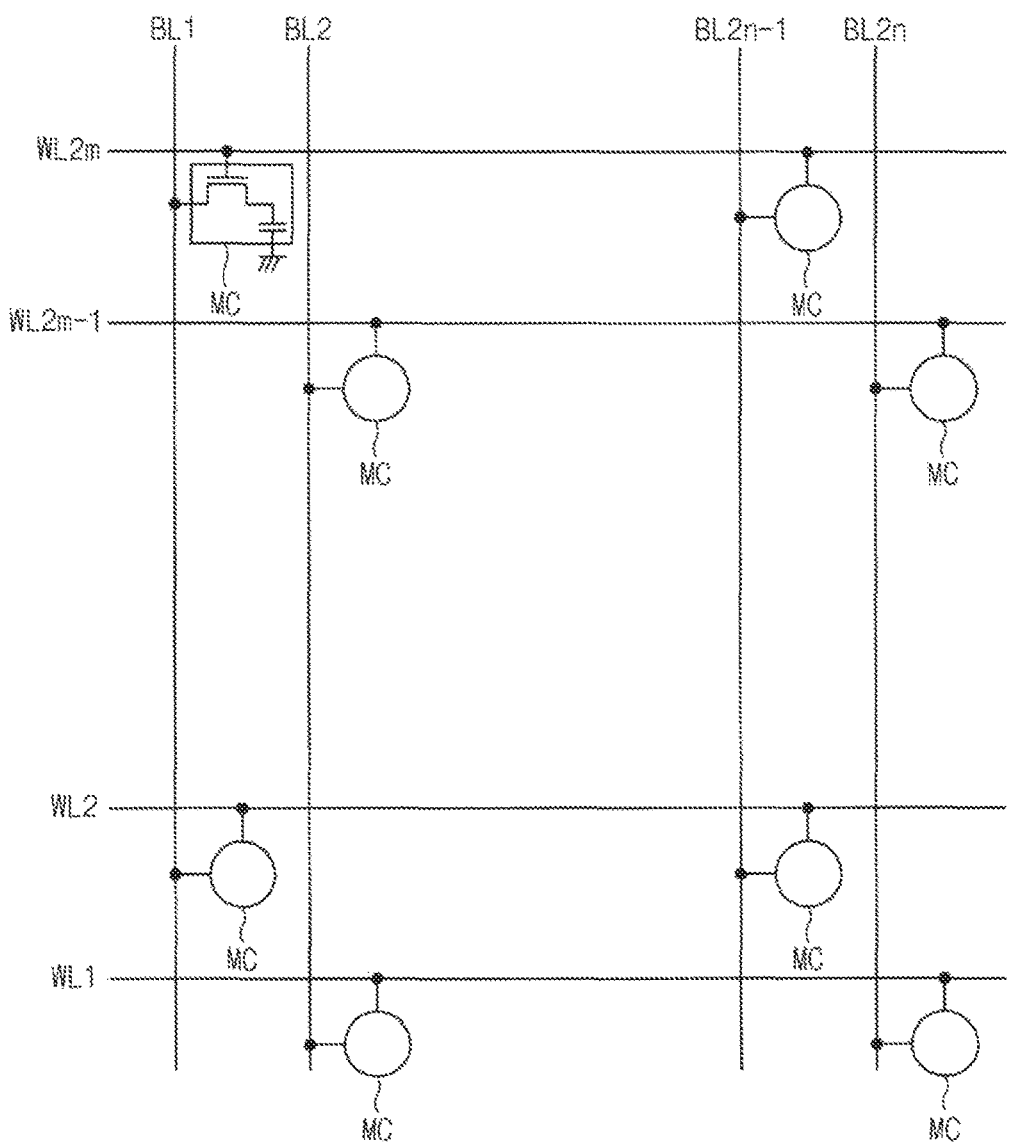
FIG. 4 illustrates a first bank array in the semiconductor memory device of FIG. 3 according to exemplary embodiments of the inventive concept.

FIG. 4 illustrates a first bank array of the semiconductor memory device of FIG. 3 according to an exemplary embodiment of the inventive concept.

Referring to FIG. 4, the first bank array 310 includes a plurality of word-lines WL1~WL2m (where m is a natural number greater than two), a plurality of bit-lines BL1~BL2n (where n is a natural number greater than two), and a plurality of memory cells MCs disposed near intersections between the word-lines WL1~WL2m and the bit-lines BL1~BL2n. In an exemplary embodiment of the inventive concept, each of the plurality of memory cells MCs may include a DRAM cell structure. The plurality of word-lines WL1~WL2m to which the plurality of memory cells MCs are connected may be referred to as rows of the first bank array 310 and the plurality of bit-lines BL1~BL3n to which the plurality of memory cells MCs are connected may be referred to as columns of the first bank array 310.

Figure 5:
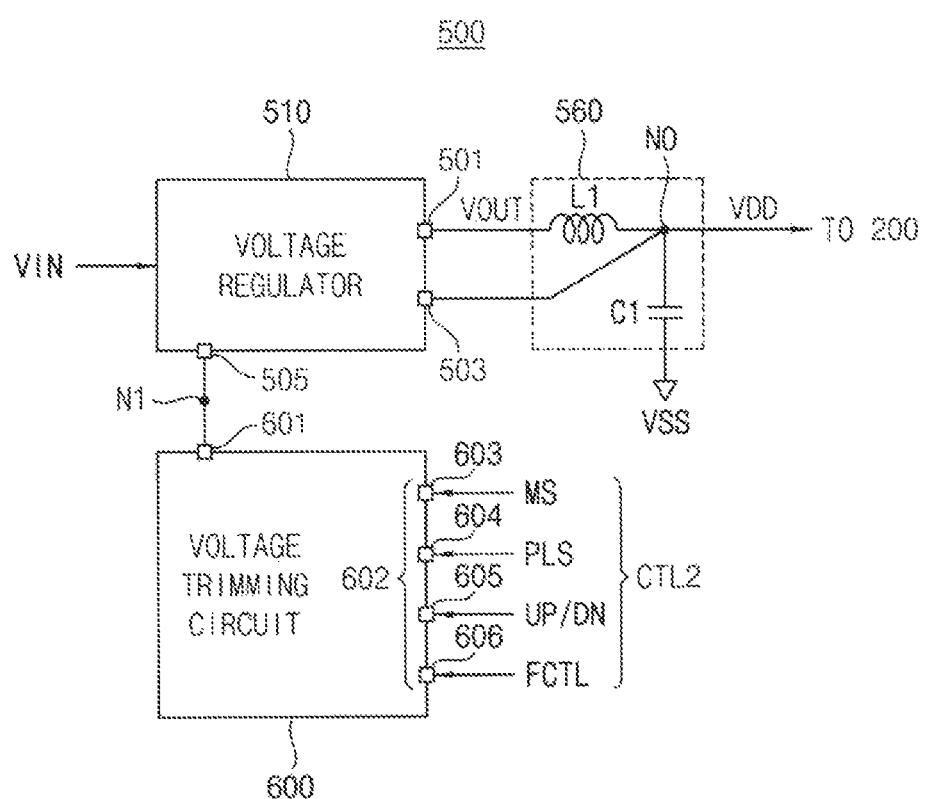
FIG. 5 is a block diagram illustrating a power management integrated circuit (PMIC) in the memory module of FIG. 1 according to exemplary embodiments of the inventive concept.

FIG. 5 is a block diagram illustrating a PMIC in the memory module of FIG. 1 according to exemplary embodiments of the inventive concept.

Referring to FIG. 5, the PMIC 500 may include a voltage regulator 510, a first low-pass filter 560, and a voltage trimming circuit 600.

The voltage regulator 510 generates an output voltage VOUT based on the input voltage VIN and outputs the output voltage VOUT at an output terminal 501. The first low-pass filter 560 filters high-frequency harmonic components of the output voltage VOUT and provides the power supply voltage VDD at an output node NO.

The first low-pass filter 560 includes an inductor L1 and a capacitor C1. The inductor L1 is coupled between the output terminal 501 and the output node NO. The capacitor C1 is coupled between the output node NO and a ground voltage VSS. The voltage regulator 510 receives the power supply voltage VDD through a feedback terminal 503. The voltage regulator 510 is connected to a connection terminal 601 of the voltage trimming circuit 600 at a first node N1 through a connection terminal 505.

The voltage trimming circuit 600 may adjust the level of the power supply voltage VDD in response to the second control signal CTL2 from the control device 110 through terminals 602. For example, the voltage trimming circuit 600 may receive a mode signal MS through a terminal 603, may receive a pulse signal PLS through a terminal 604, may receive an up/down signal UP/DN through a terminal 605, and may receive a fuse control signal FCTL through a terminal 606. The second control signal CTL2 may include the mode signal MS, the pulse signal PLS, the up/down signal UP/DN, and the fuse control signal FCTL.

Figure 6:
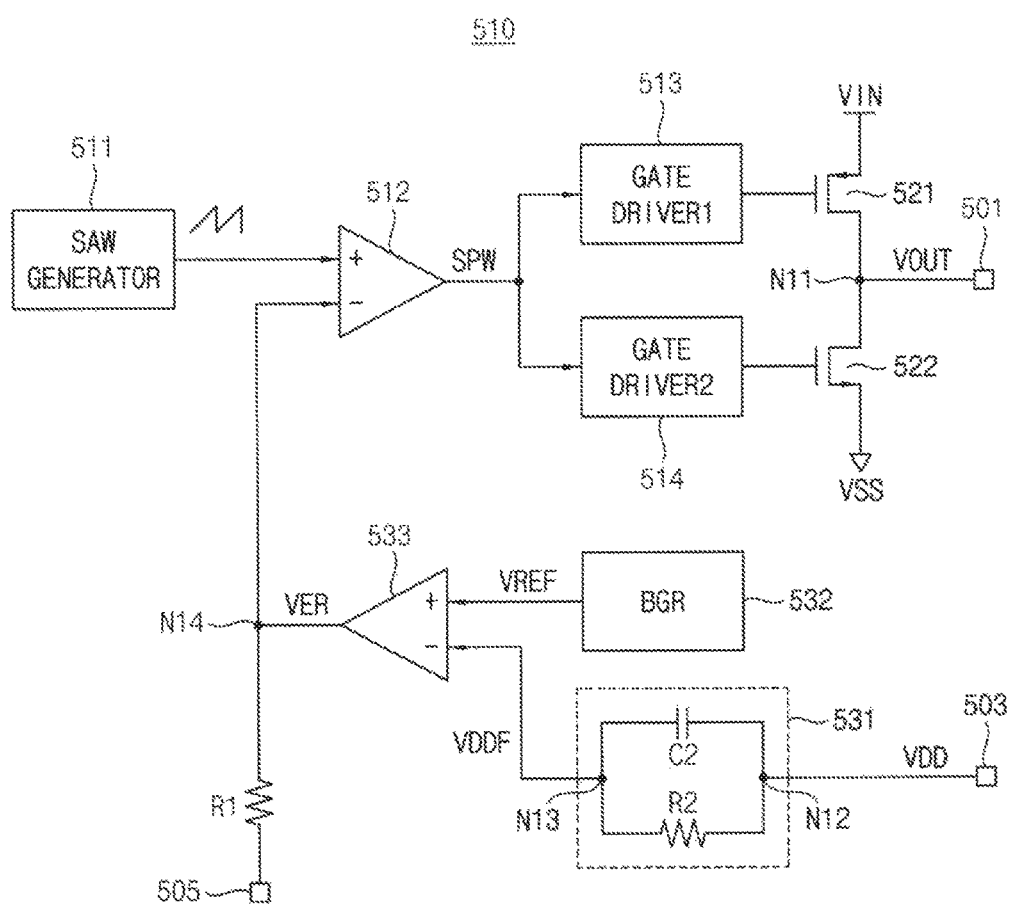
FIG. 6 is a circuit diagram illustrating a voltage regulator of FIG. 5 according to exemplary embodiments of the inventive concept.

FIG. 6 is a circuit diagram illustrating a voltage regulator of FIG. 5 according to exemplary embodiments of the inventive concept.

Referring to FIG. 6, the voltage regulator 510 may include a saw-tooth wave generator 511, a pulse-width modulation comparator 512, first and second gate drivers 513 and 514, a p-channel metal-oxide semiconductor (PMOS) transistor 521, an n-channel metal-oxide semiconductor (NMOS) transistor 522, a second low-pass filter 531, a reference voltage generator 532, an error amplifier 533, and a first resistor R1.

The PMOS transistor 521 includes a source receiving the input voltage VIN, a gate connected to an output of the first gate driver 513, and a drain connected to a node N11. The NMOS transistor 522 includes a drain connected to the node N11, a gate connected an output of the second gate driver 514, and a source connected to the ground voltage VSS. The output voltage VOUT is provided through the output terminal 501 at the node N11.

The second low-pass filter 531 is connected between a node N12 and a node N13 and includes a capacitor C2 and a second resistor R2 connected in parallel between the node N12 and the node N13. The power supply voltage VDD is provided to the second low pass filter 531 through the feedback terminal 503. The second low-pass filter 531 filters high-frequency harmonic components of the power supply voltage VDD to provide a filtered voltage VDDF.

The error amplifier 533 amplifies a voltage difference between a reference voltage VREF from the reference voltage generator 532 and the filtered voltage VDDF to output an error voltage VER. The error amplifier 533 has a positive input terminal to receive the reference voltage VREF, a negative input terminal to receive the filtered voltage VDDF, and an output terminal to provide the error voltage VER. The error voltage VER is provided to a node N14.

The pulse-width modulation comparator 512 compares the error voltage VER and a saw-tooth wave from the saw-tooth wave generator 511 to output a pulse signal SPW having a pulse width corresponding to a voltage difference between the error voltage VER and the saw-tooth wave. The pulse-width modulation comparator 512 includes a negative input terminal to receive the error voltage VER, a positive input terminal to receive the saw-tooth wave, and an output terminal to provide the pulse signal SPW.

The first gate driver 513 drives the PMOS transistor 521 in response to the pulse signal SPW and the second gate driver 514 drives the NMOS transistor 522 in response to the pulse signal SPW. Thus, the first and second gate drivers 513 and 514 complementarily operate. The node N14 is connected to the connection terminal 505 through the first resistor R1.

Figure 7:
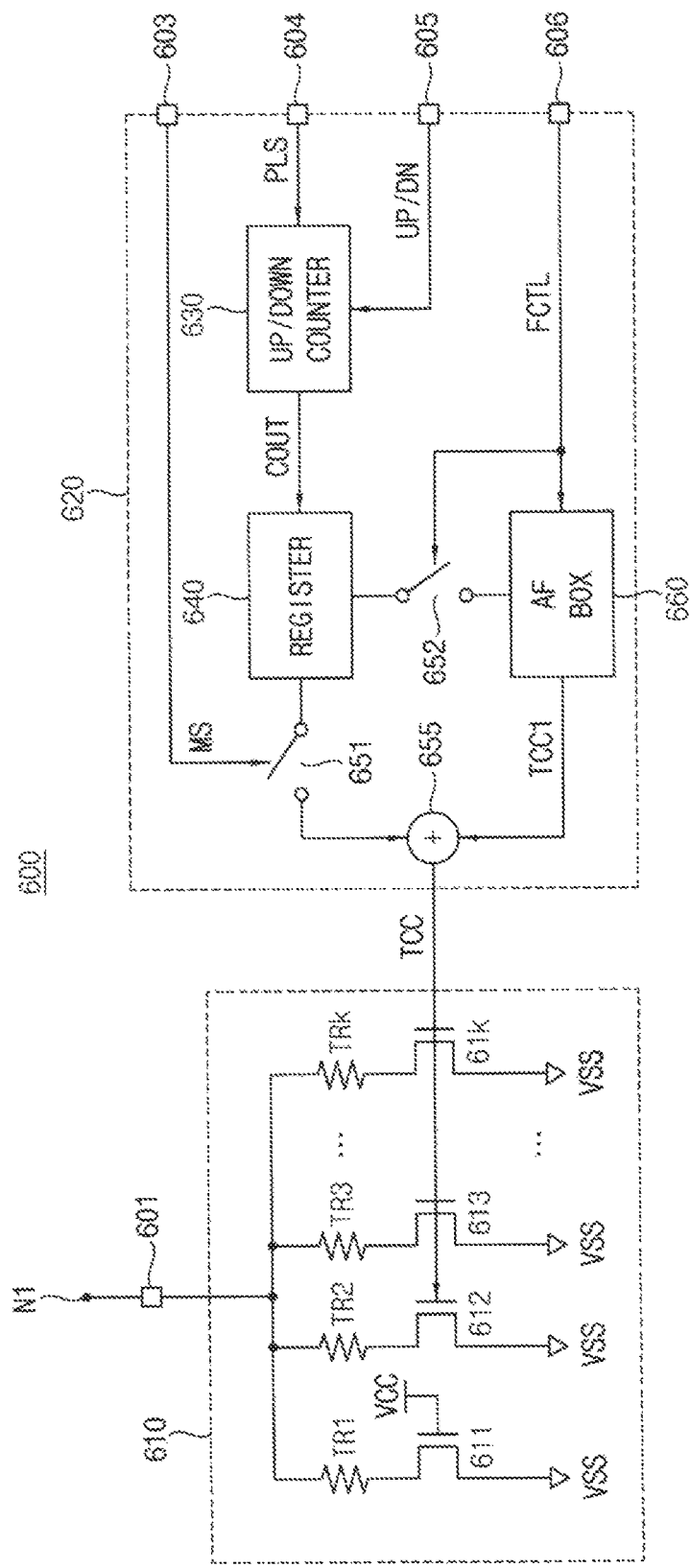
FIG. 7 is a circuit diagram illustrating a voltage trimming circuit in the PMIC of FIG. 5 according to exemplary embodiments of the inventive concept.

FIG. 7 is a circuit diagram illustrating a voltage trimming circuit in the PMIC of FIG. 5 according to exemplary embodiments of the inventive concept.

Referring to FIG. 7, the voltage trimming circuit 600 includes a trimming control circuit 620 and a trimming circuit 610.

The trimming control circuit 620 generates the trimming control code TCC while increasing or decreasing a value of the trimming control code TCC in response to the second control signal CTL2 and stores the trimming control code TCC associated with the minimum level of the power supply voltage VDD at which the semiconductor memory devices 200 operate normally. The trimming control circuit 620 may provide the trimming control code TCC to the trimming circuit 610.

The trimming circuit 610 is connected to the voltage regulator 510 at the first node N1 and may adjust the level of the power supply voltage VDD in response to the trimming control code TCC. The trimming circuit 610 may adjust the level of the power supply voltage VDD by adjusting a level of the error voltage VER.

The trimming control circuit 620 may include an up/down counter 630, a register 640, a first switch 651, a second switch 652, a nonvolatile storage 660, and an adder 655. The nonvolatile storage 660 may be implemented with a fuse box, an anti-fuse box, or an EEPROM.

The up/down counter 630 receives the pulse signal PLS through the terminal 604, and performs a counting operation based on the pulse signal PLS to output a counting output signal COUT. The up/down counter 630 may increase or decrease a value of the counting output signal COUT in response to the up/down signal UP/DN received through the terminal 605.

For example, the up/down counter 630 may change bits of the counting output signal COUT such that the value of the counting output signal COUT is increased or decreased. The up/down counter 630 performs an up-counting operation to increase the value of the counting output signal COUT, in response to an enabled up signal UP. The up/down counter 630 performs a down-counting operation to decrease the value of the counting output signal COUT, in response to an enabled down signal DN.

The register 640 is connected to the up/down counter 630 and stores the counting output signal COUT. The register 640 may be connected to the first switch 651 and the second switch 652.

The first switch 651 is connected between the register 640 and the adder 655, and selectively connects the register 640 to the adder 655 in response to the mode signal MS received through the terminal 603. Thus, the first switch 651 may selectively provide the adder 655 with the counting output signal COUT stored in the register 640 in response to the mode signal MS. The second switch 652 is connected between the register 640 and the nonvolatile storage 660 and may selectively provide the nonvolatile storage 660 with the counting output signal COUT stored in the register 640 in response to the fuse control signal FCTL received through the terminal 606.

When the mode signal MS designates the test mode or a training mode, the first switch 651 connects the register 640 to the adder 655. When the mode signal MS designates the normal mode, the first switch 651 disconnects the register 640 from the adder 655.

When the fuse control signal FCTL is enabled, the second switch 652 connects the register 640 to the nonvolatile storage 660. The nonvolatile storage 660 may program the counting output signal COUT stored in the register 640 in a nonvolatile array therein in response to the enabled fuse control signal FCTL and a connection of the second switch 652.

The adder 655, in the test mode, may provide the trimming circuit 610 with the counting output signal COUT stored in the register 640 as the trimming control code TCC. When the test on the semiconductor memory devices 200 is completed and the counting output signal COUT is programmed in the nonvolatile storage 660, the adder 655, in the normal mode, may provide the trimming circuit 610 with the counting output signal COUT programmed in the nonvolatile storage 660 as a first trimming control code TCC1.

In the training mode of the memory module 100, the adder 655 may provide the trimming circuit 610 with a sum of the counting output signal COUT stored in the register 640 and the counting output signal COUT programmed in the nonvolatile storage 660.

The trimming circuit 610 includes a plurality of trimming resistors TR1~TRk (where k is a natural number greater than two) and a plurality of NMOS transistors 611~61k. The trimming resistors TR1~TRk are connected in parallel with one another at the first node N1, and each of the NMOS transistors 611~61k is coupled between a corresponding one of the trimming resistors TR1~TRk and the ground voltage VSS. The NMOS transistor 611 of the NMOS transistors 611~61k has a gate coupled to a high-level voltage VCC and each gate of the other NMOS transistors 612~61k may receive a corresponding bit of the trimming control code TCC.

Referring to FIGS. 6 and 7, for example, when the up/down counter 630 performs the up-counting operation, a number of bits having high levels in the counting output signal COUT may be increased. Therefore, a number of NMOS transistors, among the NMOS transistors 612~61k, which are turned-on is increased, and a level of the error voltage VER at the first node Ni is decreased. When the level of the error voltage VER is decreased, a width of the pulse signal SPW is decreased and the first gate driver 513 may increase a turn-on timing of the PMOS transistor 521 to increase the level of the output voltage VOUT. When the level of the output voltage VOUT is increased, the level of the power supply voltage VDD is increased.

For example, when the up/down counter 630 performs the down-counting operation, a number of bits having high levels in the counting output signal COUT may be decreased. Therefore, a number of NMOS transistors, among the NMOS transistors 612~61k, which are turned-on is decreased, and a level of the error voltage VER at the first node Ni is increased. When the level of the error voltage VER is increased, the width of the pulse signal SPW is increased and the second gate driver 514 may increase a turn-on timing of the NMOS transistor 522 to decrease the level of the output voltage VOUT. When the level of the output voltage VOUT is decreased, the level of the power supply voltage VDD is decreased.

Figure 8:
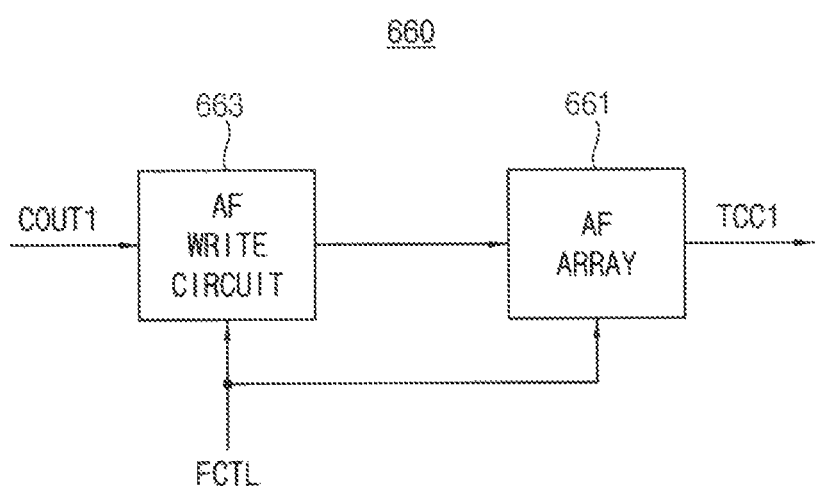
FIG. 8 is a block diagram illustrating a nonvolatile storage in the trimming control circuit of FIG. 7 according to exemplary embodiments of the inventive concept.

FIG. 8 is a block diagram illustrating a nonvolatile storage in the trimming control circuit of FIG. 7 according to exemplary embodiments of the inventive concept.

Referring to FIG. 8, the nonvolatile storage 660 includes a nonvolatile array 661 and a write circuit 663.

The nonvolatile array 661 is a nonvolatile memory for storing a first counting output signal COUT1. The nonvolatile array 661 provides the first counting output signal COUT1 as the first trimming control code TCC1 in response to the fuse control signal FCTL. The write circuit 663 is a write circuit for programming the nonvolatile array 661. The write circuit 663 programs the first counting output signal COUT1 in the nonvolatile array 661 in response to the fuse control signal FCTL.

Figure 9:
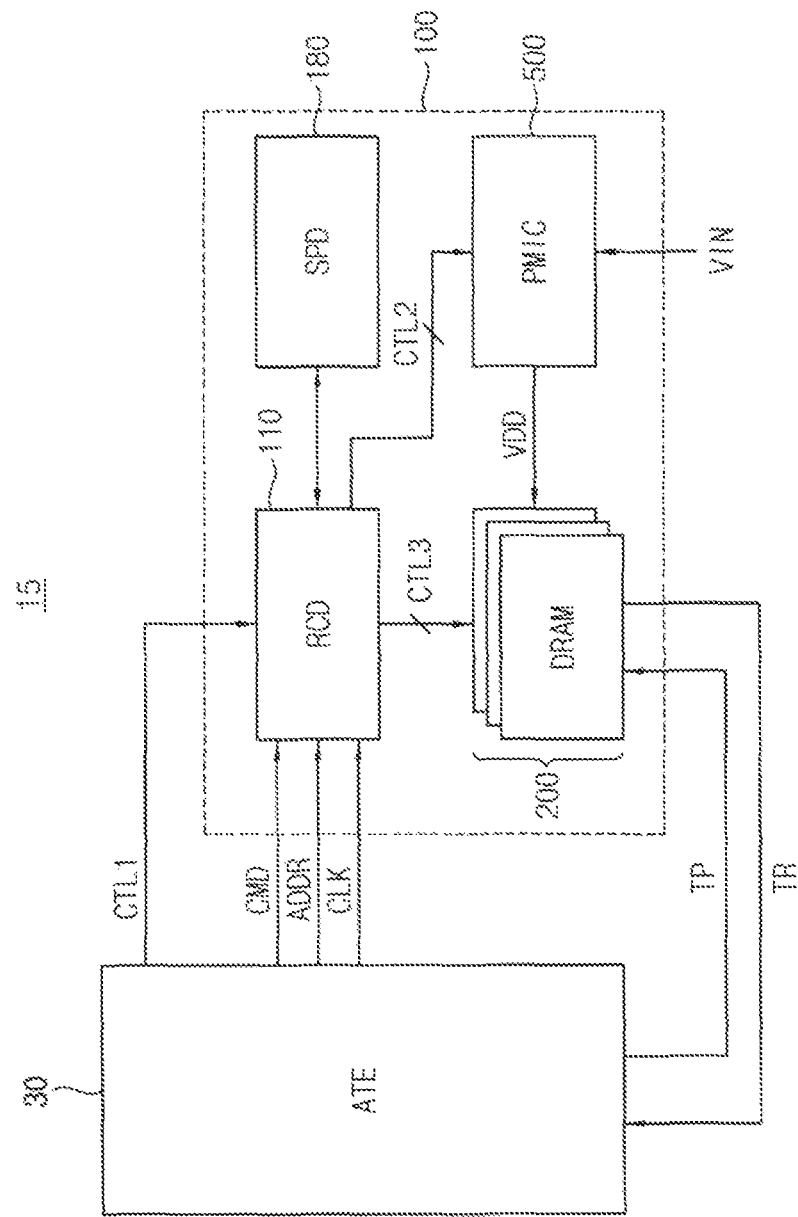
FIG. 9 illustrates a test system of a memory module according to exemplary embodiments of the inventive concept.

FIG. 9 illustrates a test system of a memory module according to exemplary embodiments of the inventive concept.

Referring to FIG. 9, a test system 15 includes an automated test equipment (ATE) 30 and the memory module 100. Configuration and operation of the memory module 100 is described with reference to FIG. 1, and thus, detailed description of the memory module 100 hereinafter will be omitted.

The ATE 30 provides the semiconductor memory devices 200 with the test pattern data TP at a given level of the power supply voltage VDD, receives the test result data TR responding to the test pattern data TP from the semiconductor memory devices 200, and determines pass/fail (e.g., a test result) of the semiconductor memory devices 200 based on a result of the comparison of the test pattern data TP and the test result data TR.

The ATE 30 may provide the control device 110 with a first control signal CTL1 that indicates the pass/fail (test result) of the semiconductor memory devices 200. The control device 110 decodes the first control signal CTL1 and provides the PMIC 500 with the second control signal CTL2 reflecting the test result. The PMIC 500 performs an operation to adjust the level of the power supply voltage VDD in response to the second control signal CTL1 as described above.

The command CMD that the ATE 30 provides the control device 110 may designate the test mode or may designate an end of the test.

Figure 10:
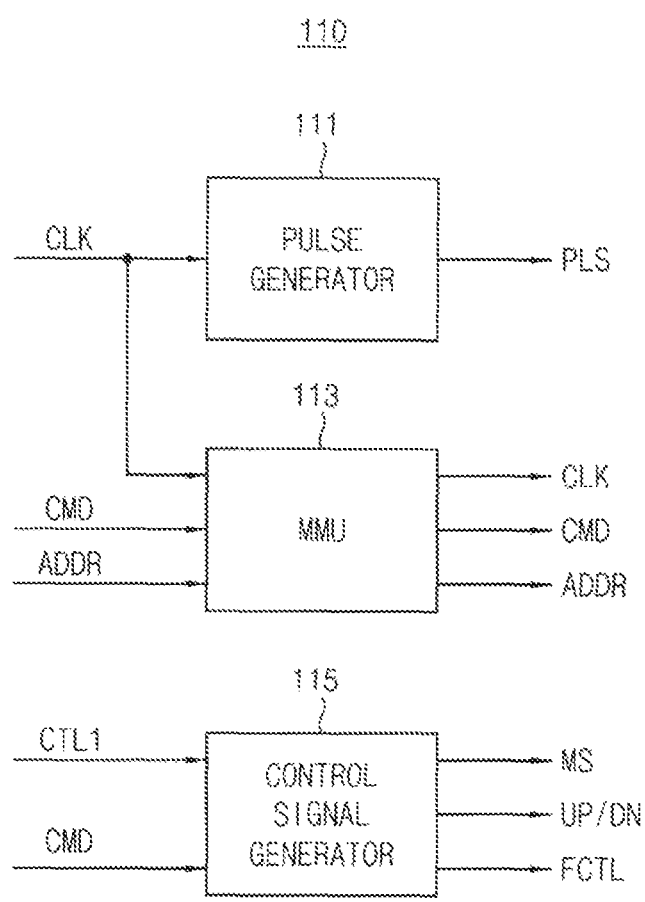
FIG. 10 is a block diagram illustrating a control device in FIG. 1 or 9 according to exemplary embodiments of the inventive concept.

FIG. 10 is a block diagram illustrating a control device in FIG. 1 or 9 according to exemplary embodiments of the inventive concept.

Referring to FIG. 10, the control device 110 may include a pulse generator 111, a memory management unit (MMU) 113, and a control signal generator 115.

The pulse generator 111 receives the clock signal CLK and generates the pulse signal PLS based on the clock signal CLK. The MMU 113 receives the clock signal CLK, the command CMD, and the address ADDR, and repeats the clock signal CLK, the command CMD, and the address ADDR to the semiconductor memory devices 200. The control signal generator 115 receives the first control signal CTL1 indicating the test result and the command CMD, decodes the first control signal CTL1 and the command CMD, and generates the mode signal MS, the up/down signal UP/DN, and the fuse control signal FCTL. The control device 110 may provide the PMIC 500 with the mode signal MS, the up/down signal UP/DN, and the fuse control signal FCTL, as the second control signal CTL2.

Figure 11:
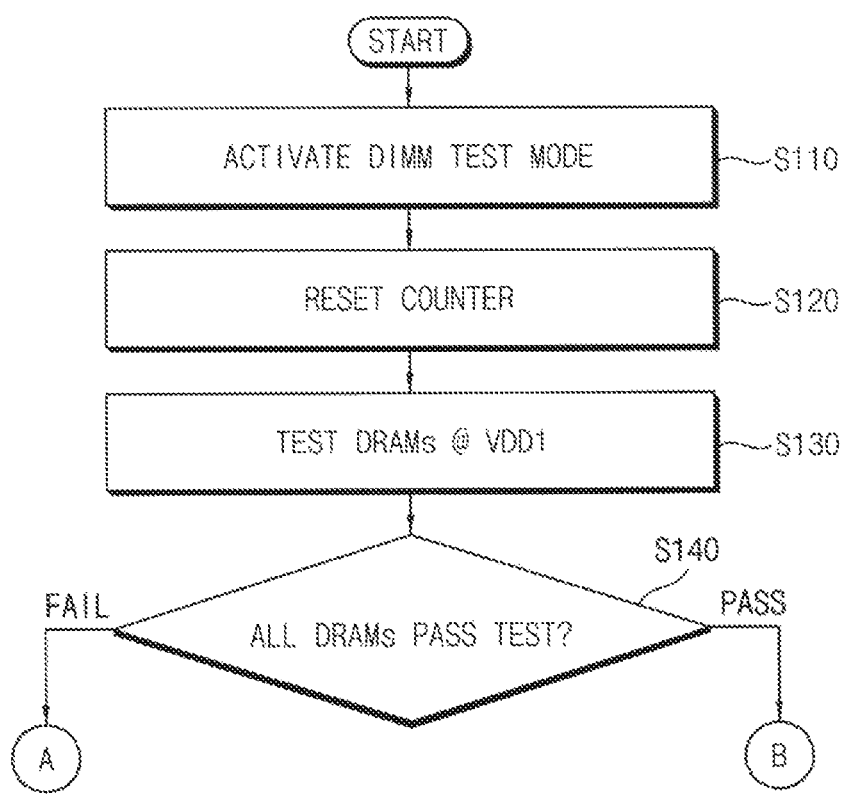
FIGS. 11 through 13 illustrate operation of the memory module of FIG. 2 in a test mode according to exemplary embodiments of the inventive concept.
Figure 12:
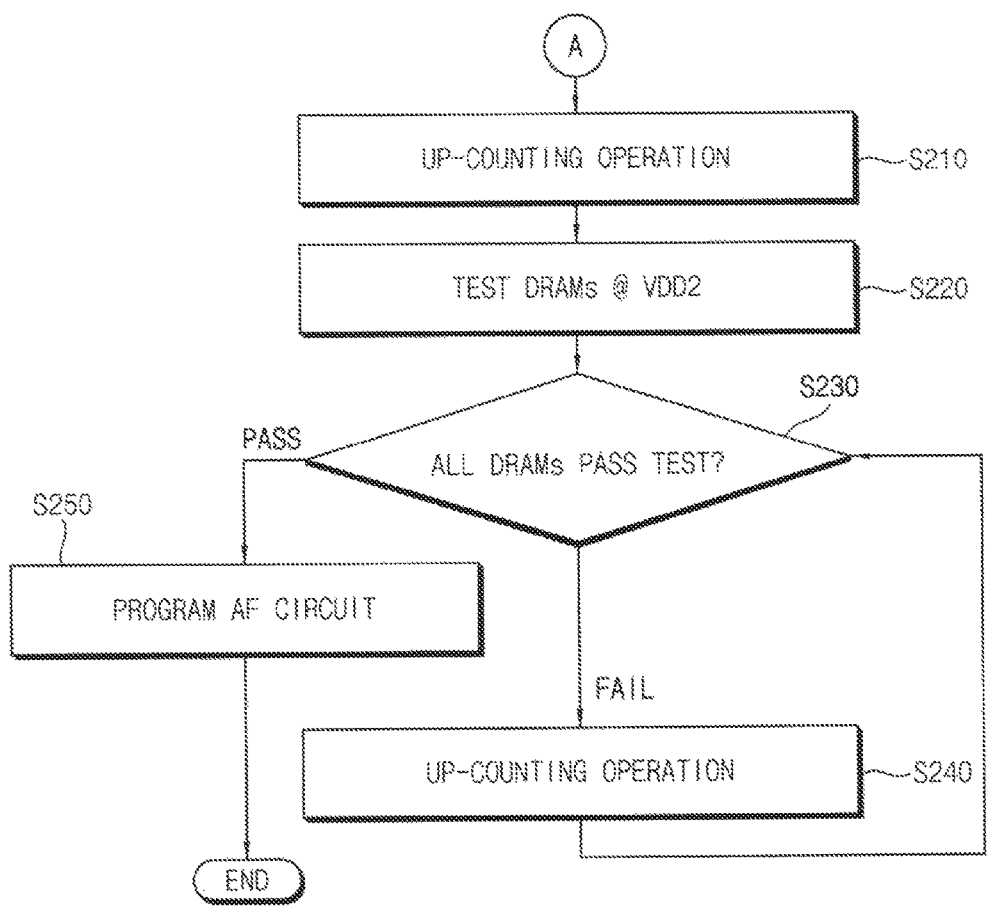
Figure 13:
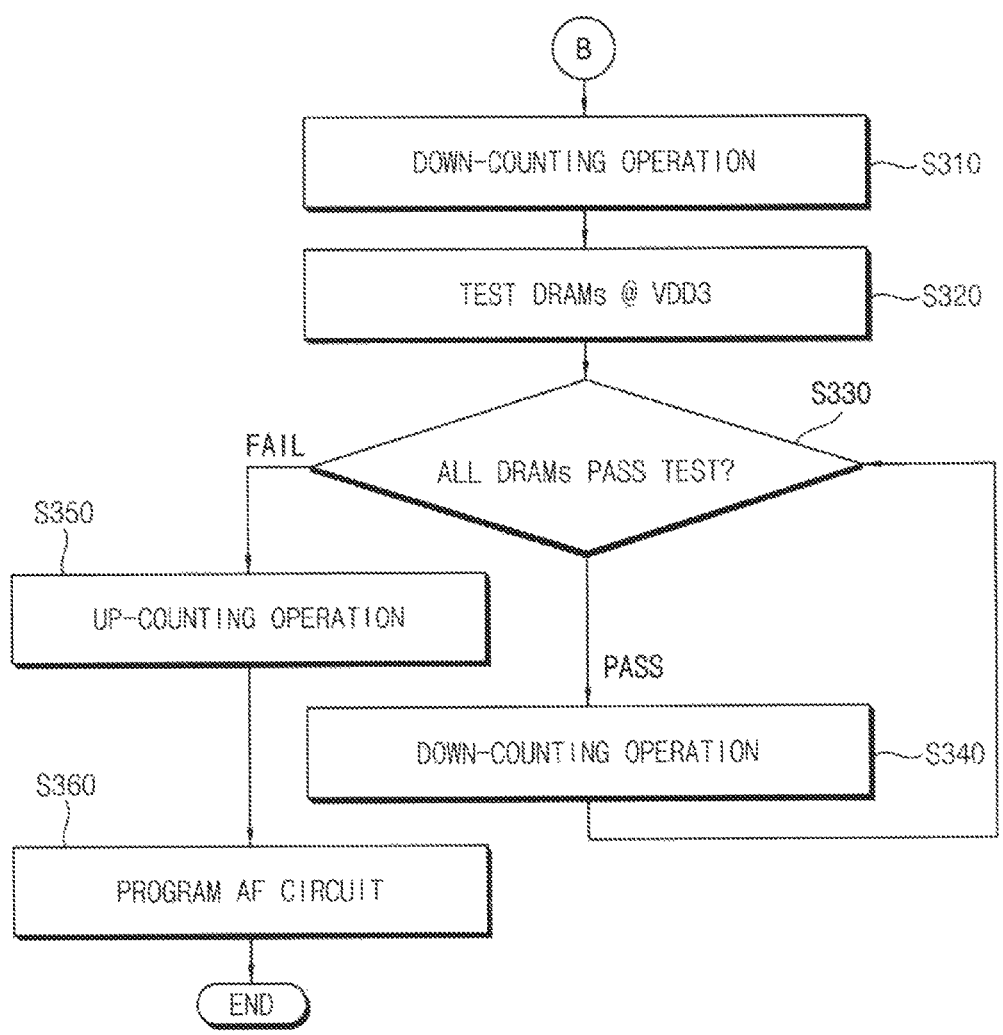

FIGS. 11 through 13 illustrate operation of the memory module of FIG. 2 in a test mode according to exemplary embodiments of the inventive concept.

Referring to FIGS. 2 through 13, in a method of operating the memory module 100 in the test mode, which includes the PMIC 500 mounted on a circuit board 101 and the plurality of semiconductor memory devices 200 mounted on the circuit board 101 and operating based on the power supply voltage VDD received from the PMIC 500, the ATE 30 applies the command CMD to the control device 110 to activate the test mode of the memory module 100 (S110). The control signal generator 115 resets the up/down counter 630 (S120).

The voltage regulator 510 generates a first power supply voltage VDD1 having a first level and provides the first power supply voltage VDD1 to the semiconductor memory devices 200. The first power supply voltage VDD1 may be a typical voltage defined in a specification of the semiconductor memory devices 200. The ATE 30 tests the semiconductor memory devices 200 operating at the first power supply voltage VDD1 (S130).

The ATE 30 receives the test result data TR from the semiconductor memory devices 200 operating at the first power supply voltage VDD1 and determines whether all of the semiconductor memory devices 200 pass the test at the first power supply voltage VDD1 (S140).

When at least one of the semiconductor memory devices 200 does not pass the test at the first power supply voltage VDD1 (FAIL in S140), which means that a voltage margin is insufficient in at least one of the semiconductor memory devices 200, the control device 110 controls the up/down counter 630 to perform the up-counting operation through the up/down signal UP/DN such that the voltage regulator 510 generates a second power supply voltage VDD2 whose level is greater than the level of the first power supply voltage VDD1 (S210). The ATE 30 tests the semiconductor memory devices 200 operating at the second power supply voltage VDD2 (S220).

The ATE 30 receives the test result data TR from the semiconductor memory devices 200 operating at the second power supply voltage VDD2 and determines whether all of the semiconductor memory devices 200 pass the test at the second power supply voltage VDD1 (S230).

When all of the semiconductor memory devices 200 pass the test at the second power supply voltage VDD2 (PASS in S230), the write circuit 663 programs the counting output signal COUT associated with the second power supply voltage VDD1 in the nonvolatile array 661 (S250).

When at least one of the semiconductor memory devices 200 does not pass the test at the second power supply voltage VDD2 (FAIL in S230), the control device 110 controls the up/down counter 630 to perform the up-counting operation such that the level of second power supply voltage VDD2 is increased (S240), and testing the semiconductor memory devices 200 at an increased level of the second power supply voltage VDD2 is repeated. The operations (S230 and S240) may be repeated until all of the semiconductor memory devices 200 pass the test.

When all of the semiconductor memory devices 200 pass the test at the first power supply voltage VDD1 (PASS in S140), which means that a voltage margin is sufficient in all of the semiconductor memory devices 200, the control device 110 controls the up/down counter 630 to perform the down-counting operation through the up/down signal UP/DN such that the voltage regulator 510 generates a third power supply voltage VDD3 whose level is smaller than the level of the first power supply voltage VDD1 (S310). The ATE 30 tests the semiconductor memory devices 200 operating at the third power supply voltage VDD3 (S320).

The ATE 30 receives the test result data TR from the semiconductor memory devices 200 operating at the third power supply voltage VDD3 and determines whether all of the semiconductor memory devices 200 pass the test at the third power supply voltage VDD3 (S330).

When at least one of the semiconductor memory devices 200 does not pass the test at the third power supply voltage VDD3 (FAIL in S330), the control device 110 controls the up/down counter 630 to perform the up-counting operation such that the level of third power supply voltage VDD3 is increased (S350), and the write circuit 663 programs the counting output signal COUT associated with the increased level of the third power supply voltage VDD3 in the nonvolatile array 661 (S360).

When all of the semiconductor memory devices 200 pass the test at the third power supply voltage VDD3 (PASS in S330), which means that a voltage margin is sufficient in all of the semiconductor memory devices 200 at the third power supply voltage VDD3, the control device 110 controls the up/down counter 630 to perform the down-counting operation through the up/down signal UP/DN such that the level of the third power supply voltage VDD3 is decreased (S340) and testing the semiconductor memory devices 200 at a decreased level of the third power supply voltage VDD3 (S330) is repeated. The operations (S340 and S330) may be repeated until at least one of the semiconductor memory devices 200 does not pass the test.

According to exemplary embodiments of the inventive concept, the semiconductor memory devices 200 in the memory module 100 are tested in the test mode, and the PMIC 500 adjusts the level of the power supply voltage VDD provided to the semiconductor memory devices 200 according to the test result. The PMIC 500 may program, in the nonvolatile storage 661 therein, the trimming control code TCC associated with a minimum level of the power supply voltage VDD at which the all of the semiconductor memory devices 200 operate normally (e.g., all of the semiconductor memory devices 200 pass the test at the minimum level of the power supply voltage VDD).

Therefore, when a voltage margin is not enough in at least some of the semiconductor memory devices 200, the PMIC 500 increases the level of the power supply voltage VDD such that all of the semiconductor memory devices 200 pass the test, and thus a yield of the memory module 100 may be increased. In addition, when all of the semiconductor memory devices 200 pass the test at a given level of the power supply voltage VDD, which means that the voltage margin is enough in all of the semiconductor memory devices 200, the PMIC 500 decreases the level of the power supply voltage VDD, and thus a power consumption of the memory module 100 in the normal mode may be reduced.

Figure 14:
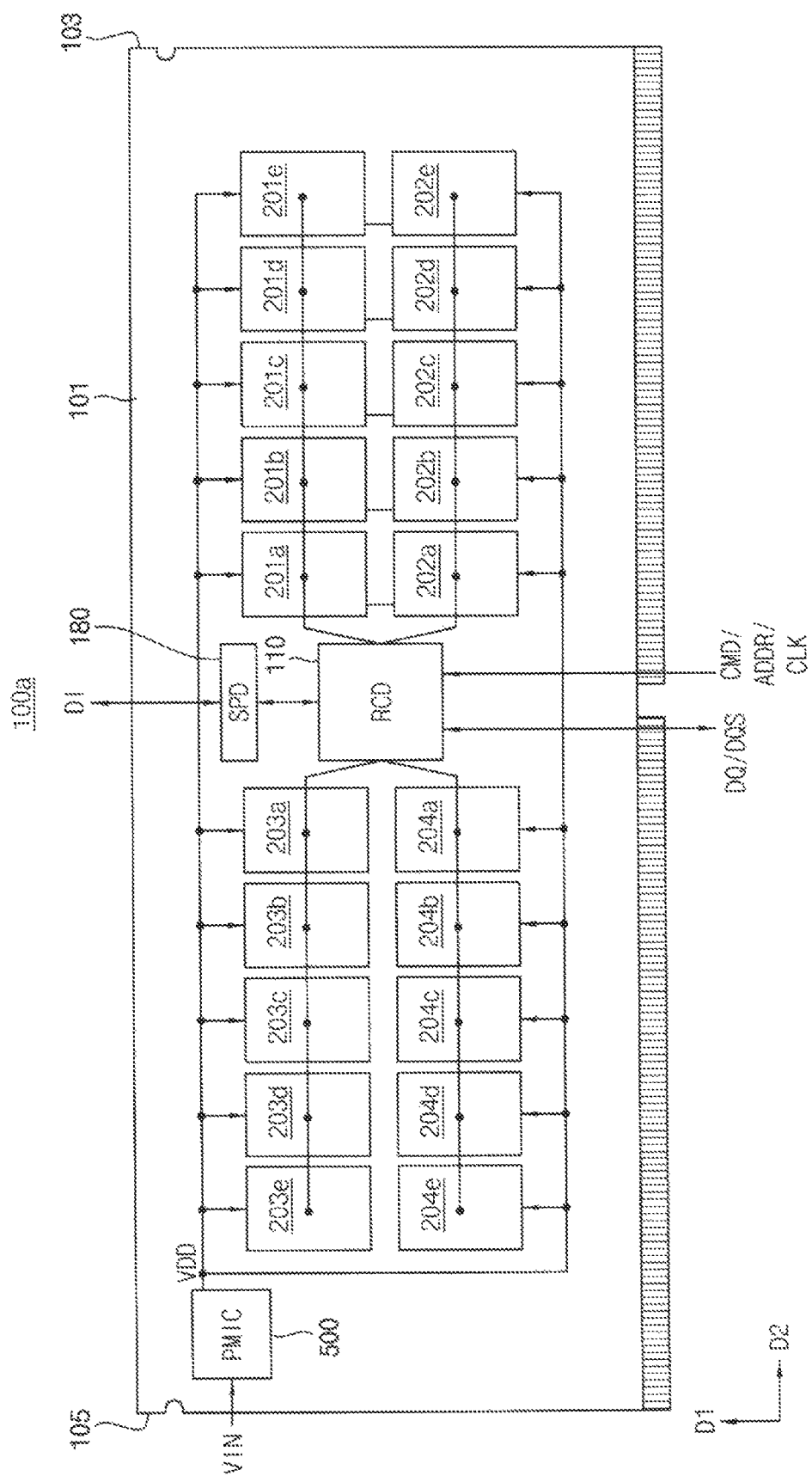
FIG. 14 is a block diagram illustrating the memory module of FIG. 1 according to exemplary embodiments of the inventive concept.

FIG. 14 is a block diagram illustrating the memory module of FIG. 1 according to exemplary embodiments of the inventive concept.

A memory module 100a of FIG. 14 differs from the memory module 100 of FIG. 2 in that the memory module 100a does not include data buffers which receive/transmit the data signal DQ and the data strobe signal DQS from/to the plurality of semiconductor memory devices 201a~201e, 202a~202e, 203a~203e, and 204a~204e. The memory module 100a may receive/transmit the data signal DQ and the data strobe signal DQS from/to the memory controller 25 or the ATE 30 through the control device 110.

Although it is illustrated that the PMIC 500 is disposed to be adjacent to the second edge portion 105 in FIG. 14, the PMIC 500 may be disposed in a central portion of the circuit board 101 to be adjacent to the control device 110 in exemplary embodiments of the inventive concept.

Figure 15:
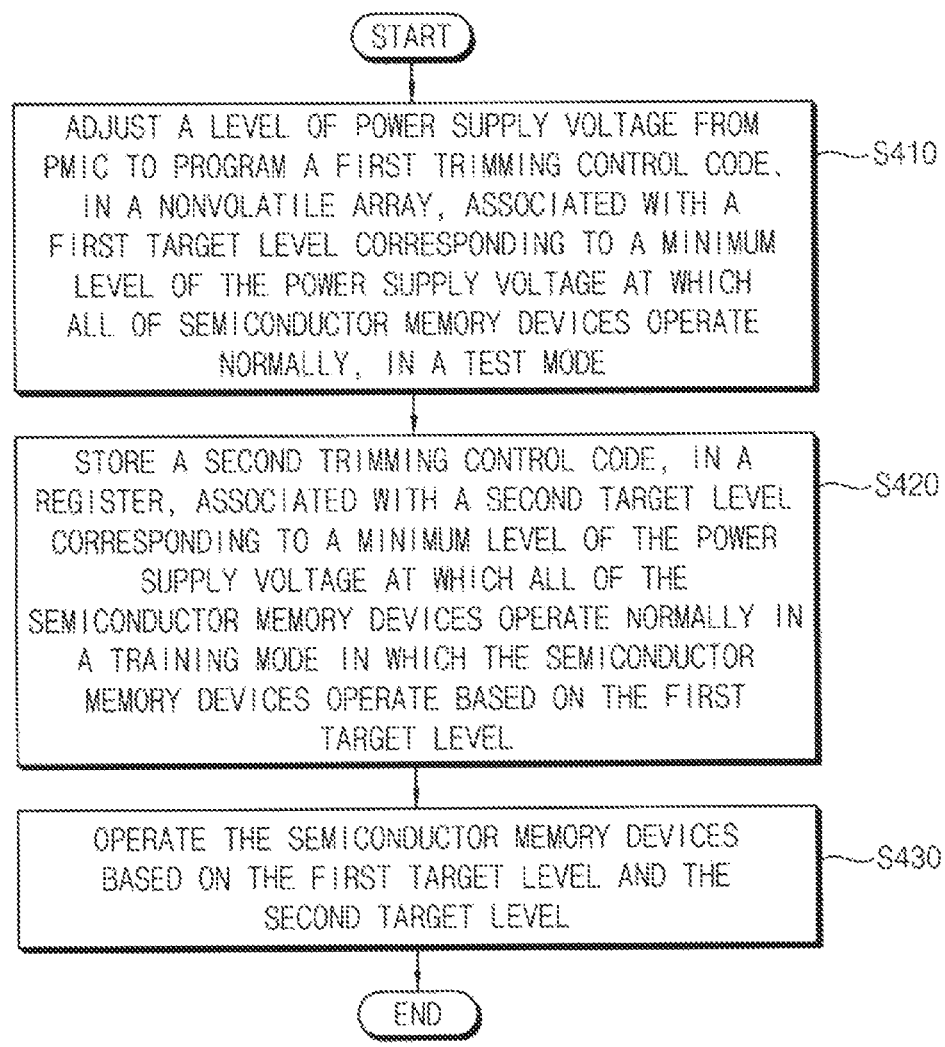
FIG. 15 is a flowchart illustrating a method of operating a memory module according to exemplary embodiments of the inventive concept.

FIG. 15 is a flowchart illustrating a method of operating a memory module according to exemplary embodiments of the inventive concept.

Referring to FIGS. 1 through 15, in a method of operating the memory module 100, which includes the PMIC 500 mounted on the circuit board 101 and the plurality of semiconductor memory devices 200 mounted on the circuit board 101 and operating based on the power supply voltage VDD received from the PMIC 500, the first trimming control code TCC1 is programmed in the nonvolatile storage 660, which is associated with a minimum level of the power supply voltage VDD at which all of the semiconductor memory devices 200 operate normally (e.g., when all of the semiconductor memory devices 200 pass the test) based on the PMIC 500 adjusting the level of the power supply voltage VDD in the test mode of the memory module 100 (S410).

Testing the memory module 100 may be performed while the memory module 100 is being manufactured. The operation S410 may correspond to operations in the test mode described with reference to FIGS. 11 through 13.

When the test of the memory module 100 is completed, after the first trimming control code TCC1 is programmed in the nonvolatile storage 660 and the first trimming control code TCC1 is fixed, in the training mode (which is instructed by the memory controller 25), a training operation is performed, for searching for a second trimming control code TCC2 associated with a second target level corresponding to a minimum level of the power supply voltage VDD while operating the semiconductor memory devices 200 from a first target level of the power supply voltage VDD, and adjusting the level of the power supply voltage VDD. When all of the semiconductor memory devices 200 operate normally at the first target level of the power supply voltage VDD, all bits of the second trimming control code TCC2 may have low levels.

When at least some of the semiconductor memory devices 200 do not operate normally, the PMIC 500 adjust the trimming control code TCC such that the level of the power supply voltage VDD is increased, and the PMIC 500 stores the second trimming control code TCC2 in the register 420, where the second trimming control code TCC2 is associated with the second target level at which all of the semiconductor memory devices 200 operate normally (S420).

When the memory module 100 exits from the training mode, the voltage regulator 510 generates the power supply voltage VDD according to the trimming control code TCC corresponding to a sum of the first trimming control code TCC1 programmed in the nonvolatile storage 660 and the second trimming control code TCC2 stored in the register 640, and provides the generated power supply voltage VDD to the semiconductor memory devices 200 to operate the semiconductor memory devices 200 (S430). Therefore, the semiconductor memory devices 200 may receive the power supply voltage VDD that has a minimum level at which the semiconductor memory devices 200 operate normally and may operate based on the received power supply voltage VDD.

Figure 16:
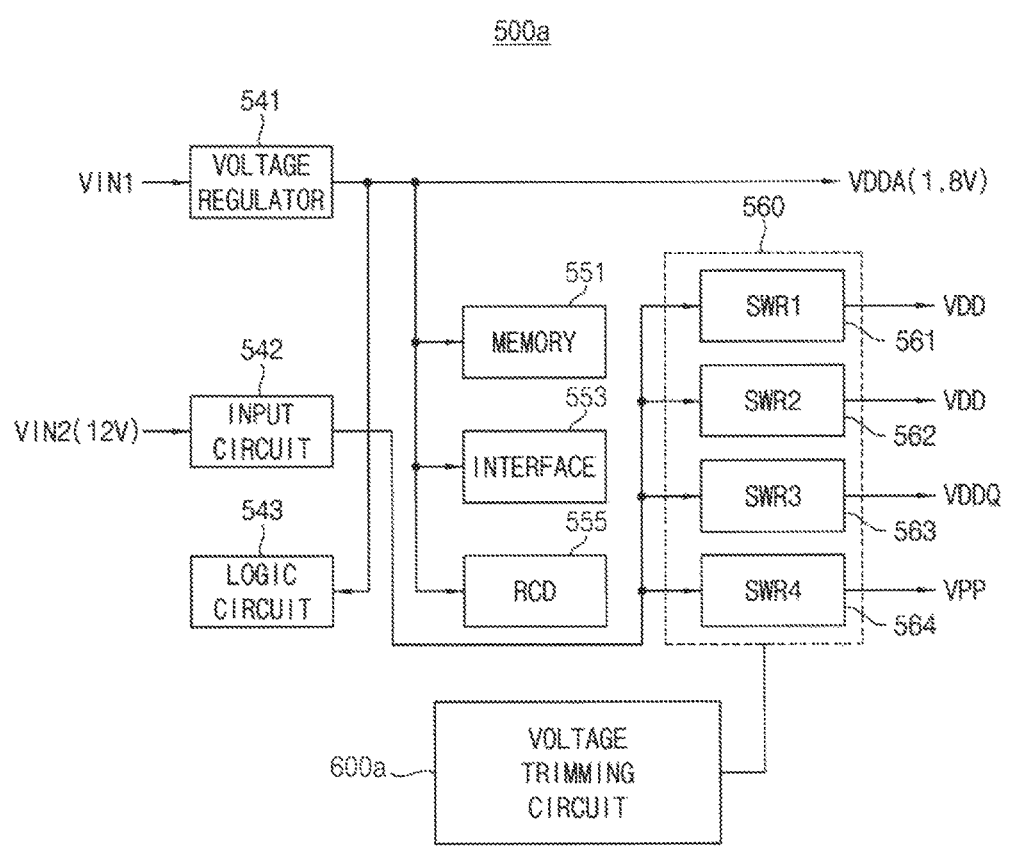
FIG. 16 is a block diagram illustrating a PMIC according to exemplary embodiments of the inventive concept.

FIG. 16 is a block diagram illustrating a PMIC according to exemplary embodiments of the inventive concept.

Referring to FIG. 16, a PMIC 500a includes a voltage regulator 541, an input circuit 542, a logic circuit 543, a memory 551, an interface 553, a control device 555, a switching regulator unit 560, and a voltage trimming circuit 600a. The switching regulator unit 560 may include first through fourth switching regulators 561~564.

The voltage regulator 541 may be implemented with a low drop-out (LDO) regulator, may receive a first input voltage VIN1 corresponding to a bulk voltage, and may generate a power supply voltage VDDA. The voltage regulator 541 may provide the power supply voltage VDDA to the logic circuit 543, the memory 551, the interface 553, and the control device 555, and may provide the power supply voltage VDDA to the semiconductor memory devices 200.

The input circuit 542 receives a second input voltage VIN2 and provides the second input voltage VIN2 to the first through fourth switching regulators 561~564. Each of the first and second switching regulators 561 and 562 generates the power supply voltage VDD based on the second input voltage VIN2, the third switching regulator 563 generates a power supply voltage VDDQ based on the second input voltage VIN2, and the fourth switching regulator 564 generates a high power supply voltage VPP based on the second input voltage VIN2. The second input voltage VIN2 may be about 12 V.

The logic circuit 543 may include an analog-to-digital converter, an oscillator, or the like. The memory 551 may store operation data for the PMIC 500a and the interface 553 may perform interfacing with the control device 110 on the circuit board 101 and with an external device. The control device 555 may communicate with the control device 110 through the interface 553.

The voltage trimming circuit 600a may be similar to the voltage trimming circuit 600 of FIG. 7 and may adjust voltage levels of some or all of the first through fourth switching regulators 561~564.

Figure 17:
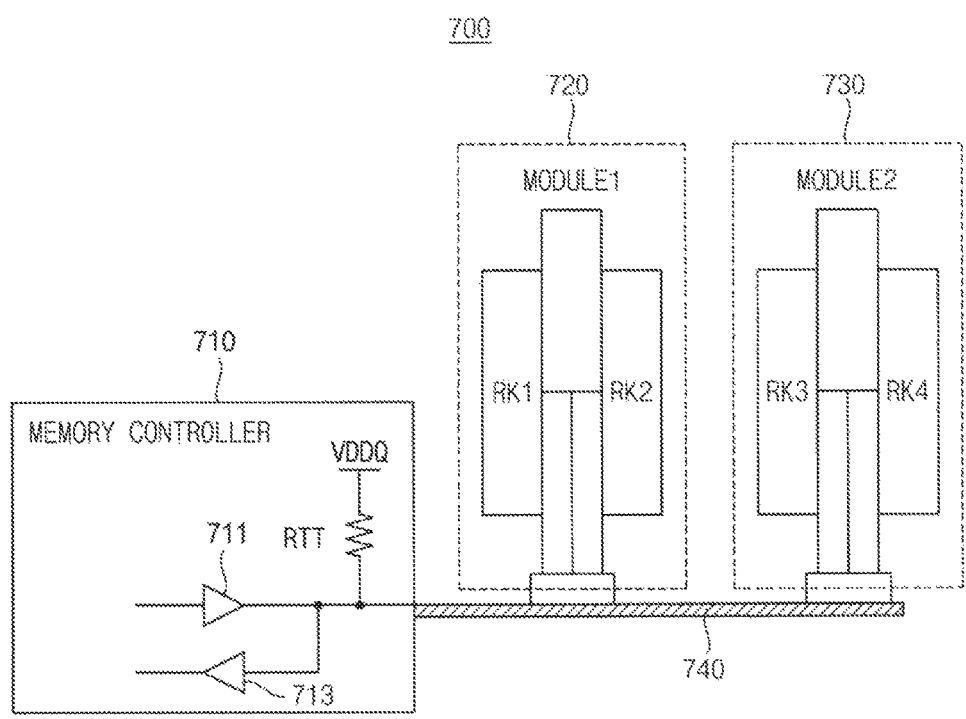
FIG. 17 is a block diagram illustrating a memory system having quad-rank memory modules according to exemplary embodiments of the inventive concept.

FIG. 17 is a block diagram illustrating a memory system having quad-rank memory modules according to exemplary embodiments of the inventive concept.

Referring to FIG. 17, a memory system 700 may include a memory controller 710 and at least one or more memory modules 720 and 730.

The memory controller 710 may control a memory module so as to perform a command supplied from a processor or host. The memory controller 710 may be implemented in a processor or host, or may be implemented with an application processor or a system-on-a-chip (SOC). For signal integrity, a source termination may be implemented with a resistor RTT on a bus 740 of the memory controller 710.

The first memory module 720 and the second memory module 730 may be coupled to the memory controller 710 through the bus 740. Each of the first memory module 720 and the second memory modules 730 may correspond to the memory module 100 of FIG. 2 or the memory module 100a of FIG. 14. The first memory module 720 may include at least one or more memory ranks RK1 and RK2, and the second memory module 730 may include at least one or more memory ranks RK3 and RK4. Each of the first memory module 720 and the second memory module 730 may include a PMIC such as the PMIC 500 of FIG. 5, and may provide a power supply voltage (e.g., VDD) and may adjust a level of the power supply voltage.

Figure 18:
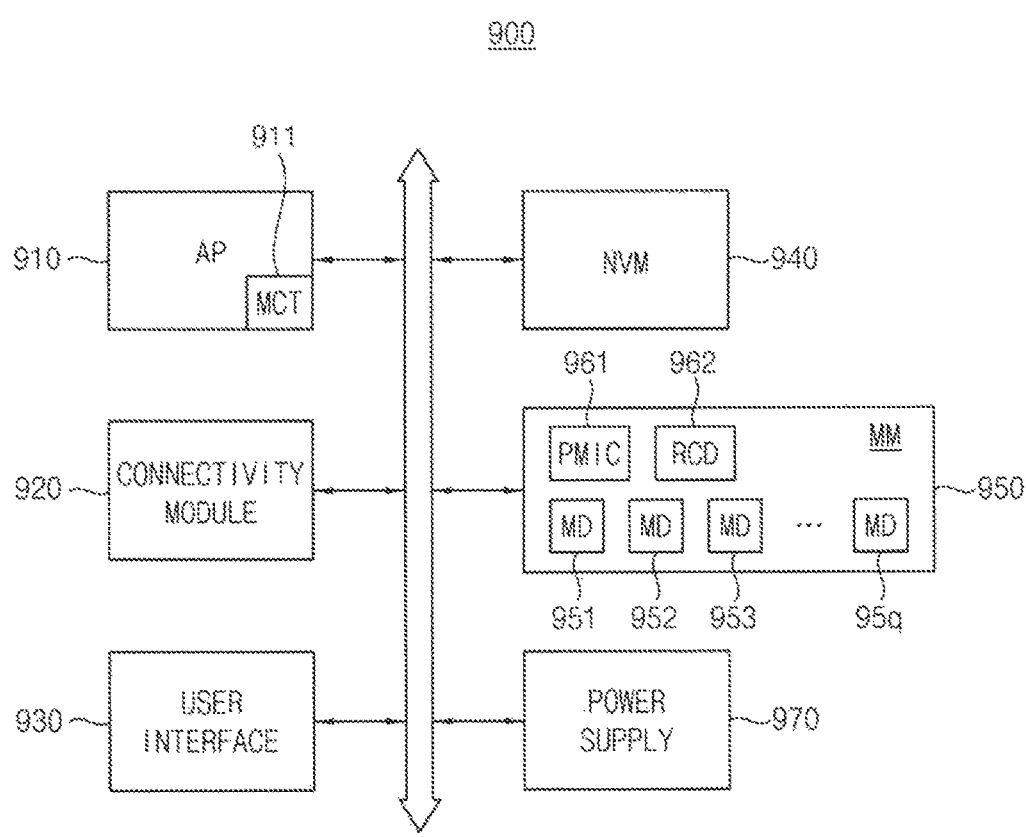
FIG. 18 is a block diagram illustrating a mobile system including a memory module according to exemplary embodiments of the inventive concept.

FIG. 18 is a block diagram illustrating a mobile system including a memory module according to exemplary embodiments of the inventive concept.

Referring to FIG. 18, a mobile system 900 may include an application processor 910, a connectivity module 920, a memory module 950, a nonvolatile memory device 940, a user interface 930, and a power supply 970. The application processor 910 may include a memory controller 911.

The application processor 910 may execute applications, such as a web browser, a game application, a video player, etc. The connectivity module 920 may perform wired or wireless communication with an external device.

The memory module 950 may store data processed by the application processor 910 or operate as a working memory. The memory module 950 may include a plurality of semiconductor memory devices 951~95q (where q is a natural number greater than three), a PMIC 961, and a control device 962. The PMIC 961 may generate a power supply voltage (e.g., VDD) provided to the semiconductor memory devices 951~95q and may adjust a level of the power supply voltage.

The nonvolatile memory device 940 may store a boot image for booting the mobile system 900. The user interface 930 may include at least one input device, such as a keypad, a touch screen, etc., and at least one output device, such as a speaker, a display device, etc. The power supply 970 may supply an operating voltage to the mobile system 900.

In exemplary embodiments of the inventive concept, the mobile system 900 and/or components of the mobile system 900 may be packaged in various forms.

Exemplary embodiments of the inventive concept as described above may be applied to systems using memory modules.

Accordingly, a memory module, including a plurality of semiconductor memory devices mounted on a circuit board and a PMIC to provide a power supply voltage to the semiconductor memory devices, may store a trimming control code associated with a minimum level of the power supply voltage at which the semiconductor memory devices operate normally in a test mode. Therefore, a yield of the memory module may be increased and/or power consumption of the memory module may be reduced.

While the inventive concept has been shown and described above with reference to exemplary embodiments thereof, it will be apparent to those of ordinary skill in the art that modifications and variations in form and details may be made thereto without departing from the spirit and scope of the inventive concept, as set forth by the following claims.

What is claimed is:

1. A memory module comprising:
a plurality of semiconductor memory devices mounted on a circuit board, wherein the plurality of semiconductor memory devices operate based on a power supply voltage;
a power management integrated circuit (PMIC) mounted on the circuit board, wherein the PMIC is configured to generate the power supply voltage using an input voltage, configured to provide the power supply voltage to the plurality of semiconductor memory devices, and configured to store a trimming control code associated with a first target level corresponding to a minimum level of the power supply voltage when the plurality of semiconductor memory devices operate normally in a test mode, and
a control device configured to control the PMIC in response to a first control signal received from an external device,
wherein during the test mode, the PMIC is configured to adjust a level of the power supply voltage, configured to test the semiconductor memory devices using the adjusted power supply voltage, and configured to store the trimming control code based on a result of the test.

2. The memory module of claim 1, wherein the PMIC comprises:
a voltage regulator configured to generate an output voltage using the input voltage and configured to receive the power supply voltage through a feedback terminal, wherein the output voltage is filtered to be provided as the power supply voltage; and
a voltage trimming circuit connected to the voltage regulator, wherein the voltage trimming circuit is configured to adjust the level of the power supply voltage in response to a second control signal received from the control device.

3. The memory module of claim 2, wherein the voltage trimming circuit comprises:
a trimming control circuit configured to increase or decrease a value of the trimming control code in response to the second control signal, configured to store the trimming control code when the semiconductor memory devices operate normally, and configured to provide the stored trimming control code; and
a trimming circuit connected to the voltage regulator at a first node, wherein the trimming circuit is configured to adjust the level of the power supply voltage in response to the trimming control code.

4. The memory module of claim 3, wherein the trimming control circuit comprises:
an up/down counter configured to perform a counting operation in response to a pulse signal to output a counting output signal and configured to increase or decrease a value of the counting output signal in response to an up/down signal;
an adder coupled to the trimming circuit;
a register configured to store the counting output signal;
a first switch configured to selectively connect the register to the adder in response to a mode signal;
a nonvolatile storage; and
a second switch configured to selectively provide the nonvolatile storage with the counting output signal stored in the register as a first counting output signal in response to a fuse control signal,
wherein the nonvolatile storage is configured to program the first counting output signal in a nonvolatile array therein in response to the fuse control signal and a connection of the second switch.

5. The memory module of claim 4, wherein:
the first switch is configured to connect the register to the adder when the mode signal indicates the test mode; and
the first switch is configured to disconnect the register from the adder when the mode signal indicates that the minimum level of the power supply voltage is determined.

6. The memory module of claim 4, wherein the second switch is configured to connect the register to the nonvolatile storage in response to the fuse control signal that is enabled when the minimum level of the power supply voltage is determined.

7. The memory module of claim 4, wherein:
the adder is configured to provide the trimming circuit with the counting output signal stored in the register as the trimming control code when the plurality of semiconductor memory devices are tested,
the adder is configured to provide the trimming circuit with the first counting output signal stored in the nonvolatile storage as the trimming control code after the minimum level of the power supply voltage is determined; and
the adder is configured to provide the trimming circuit with a sum of the counting output signal stored in the register and the first counting output signal stored in the nonvolatile storage as the trimming control code in a training mode when a training operation is performed on the plurality of semiconductor memory devices.

8. The memory module of claim 3, wherein the trimming circuit comprises:
a plurality of trimming resistors connected in parallel with one another at the first node; and
a plurality of n-channel metal-oxide (NMOS) transistors, each coupled between a corresponding one of the plurality of trimming resistors and a ground voltage,
wherein a first NMOS transistor of the plurality of NMOS transistors has a gate coupled to a high-level voltage, and
each gate of the plurality of the NMOS transistors except the first NMOS transistor receives a corresponding bit of the trimming control code.

9. The memory module of claim 3, wherein when at least one of the plurality of semiconductor memory devices does not operate normally at a first level of the power supply voltage in the test mode, the trimming control circuit is configured to adjust bits of the trimming control code such that the level of the power supply voltage is increased until all of the plurality of semiconductor memory devices operate normally.

10. The memory module of claim 3, wherein when all of the plurality of semiconductor memory devices operate normally at a first level of the power supply voltage in the test mode, the trimming control circuit is configured to adjust bits of the trimming control code such that the level of the power supply voltage is decreased until at least one of the plurality of semiconductor memory devices does not operate normally.

11. The memory module of claim 3, wherein:
the trimming control circuit is configured to program the trimming control code in a nonvolatile storage therein, wherein the trimming control code is associated with a minimum level of the power supply voltage determined in the test mode; and the voltage regulator is configured to generate the power supply voltage using the programmed trimming control code and configured to provide the generated power supply voltage to the plurality of semiconductor memory devices in a normal mode of the memory module.

12. The memory module of claim 1, wherein the control device comprises:

a pulse generator configured to generate a pulse signal in response to a clock signal received from the external device; and a control signal generator configured to generate a mode signal, an up/down signal, and a fuse control signal in response to the first control signal and a command received from the external device, wherein the control device is configured to provide the PMIC with the mode signal, the up/down signal, and the fuse control signal as a second control signal.

13. The memory module of claim 12, wherein:

the external device is an automated test equipment configured to apply a test pattern data to the plurality of semiconductor memory devices, configured to receive test result data responding to the test pattern from the plurality of semiconductor memory devices, and configured to determine a pass/fail of the plurality of semiconductor memory devices based on a comparison of the test pattern data and the test result data, the first control signal indicates the pass/fail of each of the plurality of semiconductor memory devices; and the control signal generator is configured to generate the up/down signal such that the level of the power supply voltage in increased when the first control signal indicates a fail of at least one of the plurality of semiconductor memory devices.

14. The memory module of claim 12, wherein:

the external device is a memory controller configured to transmit to or receive from the plurality of semiconductor memory devices, the memory controller is configured to instruct the memory module to enter into a training mode, the PMIC is configured to store a second trimming control code in a register therein while the PMIC generates the power supply voltage based on the stored trimming control code, and the second trimming control code is associated with a minimum level of the power supply voltage at which all of the plurality of semiconductor memory devices operate normally.

15. The memory module of claim 1, wherein each of the plurality of semiconductor memory devices is a double data rate 5 (DDR5) synchronous dynamic random access memory (SDRAM).

16. A method of operating a memory module, wherein the memory module comprises a plurality of semiconductor memory devices mounted on a circuit board and a power management integrated circuit (PMIC) mounted on the circuit board configured to provide a power supply voltage to the plurality of semiconductor memory devices, the method comprising:

instructing the memory module to enter into a test mode;

resetting a trimming control code associated with a level of the power supply voltage;

testing the plurality of semiconductor memory devices at a first level of the power supply voltage; and adjusting the level of the power supply voltage based on a result of testing the plurality of semiconductor memory devices with the adjusted power supply voltage.

17. The method of claim 16, wherein when the result of testing indicates that at least one of the plurality of semiconductor memory devices does not operate normally, testing the plurality of semiconductor memory devices with the adjusted power supply voltage comprises:

increasing the level of the power supply voltage to an upper level higher than the first level;

testing the plurality of semiconductor memory devices at the upper level; and programming a trimming control code in a nonvolatile storage in the PMIC after repeating the increasing and the testing until the trimming control code is associated with the level of the power supply voltage, at which all of the plurality of semiconductor memory devices operate normally.

18. The method of claim 16, wherein when the result of testing indicates that all of the plurality of semiconductor memory devices operate normally, testing the plurality of semiconductor memory devices with the adjusted power supply voltage comprises:

decreasing the level of the power supply voltage to a lower level smaller than the first level;

testing the plurality of semiconductor memory devices at the lower level;

programming a trimming control code in a nonvolatile storage in the PMIC after repeating the decreasing and the testing until the trimming control code is associated with the level of the power supply voltage, at which at least one of the semiconductor memory devices does not operate normally.

19. The method of claim 16, wherein when a first minimum level of the power supply voltage at which all of the plurality of semiconductor memory devices operate normally and after a first trimming control code associated with the first minimum level is programmed and the memory module exits from the training mode, the method further comprises:

instructing the memory module to enter into a training mode;

operating the plurality of semiconductor memory devices at the first minimum level of the power supply voltage;

adjusting the level of the power supply voltage from the first minimum level to store, in a register of the PMIC, a second trimming code associated with a second minimum level of the power supply voltage, at which all of the plurality of semiconductor memory devices operate normally; and operating the plurality of semiconductor memory devices based on the power supply voltage generated based on the first trimming control code and the second trimming control code in a normal mode.

20. A test system of a memory module, the test system comprising:

a memory module including a plurality of semiconductor memory devices mounted on a circuit board and a power management integrated circuit (PMIC) mounted on the circuit board, wherein the PMIC is configured to provide a power supply voltage to the plurality of semiconductor memory devices; and an automated test equipment (ATE) configured to test the plurality of semiconductor memory devices, wherein the memory module further comprises a control device configured to control the PMIC in response to a control signal received from the ATE, and wherein the PMIC is configured to generate the power supply voltage using an input voltage, configured to provide the power supply voltage to the plurality of semiconductor memory devices, configured to test the plurality of semiconductor memory devices by adjusting a level of the power supply voltage in a test mode, and configured to store a trimming control code associated with a minimum level of the power supply voltage when the plurality of semiconductor memory devices operate normally.

* * * * *